US008953399B2

(12) United States Patent
Ferrant et al.

(10) Patent No.: US 8,953,399 B2
(45) Date of Patent: *Feb. 10, 2015

(54) DIFFERENTIAL SENSE AMPLIFIER WITHOUT DEDICATED PASS-GATE TRANSISTORS

(75) Inventors: Richard Ferrant, Esquibien (FR); Roland Thewes, Kleinmachnow (DE)

(73) Assignee: Soitech, Bernin (FR)

( * ) Notice: Subject to any disclaimer, the term of this patent is extended or adjusted under 35 U.S.C. 154(b) by 268 days.

This patent is subject to a terminal disclaimer.

(21) Appl. No.: 13/456,047

(22) Filed: Apr. 25, 2012

(65) Prior Publication Data

US 2012/0275253 A1    Nov. 1, 2012

(30) Foreign Application Priority Data

Apr. 26, 2011   (FR) ...................................... 11 53573

(51) Int. Cl.
| G11C 7/08 | (2006.01) |
| G11C 7/06 | (2006.01) |
| G11C 7/12 | (2006.01) |
| G11C 11/4091 | (2006.01) |

(52) U.S. Cl.
CPC ............ *G11C 7/065* (2013.01); *G11C 11/4091* (2013.01); *G11C 2207/002* (2013.01)
USPC .......................................... 365/203; 365/207

(58) Field of Classification Search
None
See application file for complete search history.

(56) References Cited

U.S. PATENT DOCUMENTS

| 4,748,485 A   * | 5/1988  | Vasudev ........................ 257/353 |
| 5,646,900 A     | 7/1997  | Tsukude ........................ 365/205 |
| 6,037,808 A     | 3/2000  | Houston et al. ................. 327/55  |
| 2005/0264322 A1 | 12/2005 | Nakazato et al. ............... 327/51  |
| 2007/0153601 A1 * | 7/2007 | Savignac et al. ............... 365/207 |
| 2009/0108351 A1 * | 4/2009 | Yang et al. ..................... 257/347 |
| 2011/0122361 A1 | 5/2011  | Fujita et al. ................... 349/158 |
| 2011/0233675 A1 | 9/2011  | Mazure et al. ................. 357/347 |
| 2011/0298496 A1 * | 12/2011 | Rennie et al. .................. 327/52 |
| 2012/0275252 A1 | 11/2012 | Ferrant et al. ................. 365/203 |
| 2012/0275254 A1 | 11/2012 | Ferrant et al. ................. 365/203 |

FOREIGN PATENT DOCUMENTS

| DE | EP0411818   * | 7/1990 |
| EP | 0 411 818  A2 | 2/1991 |

(Continued)

OTHER PUBLICATIONS

Double-Gate SOI Devices, IEEE2006, Roy et al.*

(Continued)

*Primary Examiner* — Hoai V Ho
*Assistant Examiner* — James G Norman
(74) *Attorney, Agent, or Firm* — Jeffrey T. Holman

(57) ABSTRACT

A differential sense amplifier for sensing data stored in a plurality of memory cells of a memory cell array, including a first CMOS inverter having an output connected to a first bit line and an input connected to a second bit line complementary to the first bit line, and a second CMOS inverter having an output connected to the second bit line and an input connected to the first bit line. Each CMOS inverter includes a pull-up transistor and a pull-down transistor, and the sense amplifier has a pair of pass-gate transistors arranged to connect the first and second bit lines to a first and a second global bit lines. Advantageously, the pass-gate transistors are constituted by the pull-up transistors or the pull-down transistors.

20 Claims, 12 Drawing Sheets

(56) References Cited

FOREIGN PATENT DOCUMENTS

| EP | 2 365 487 A2 | | 9/2011 |
|----|----|----|----|
| GB | EP0411818 | * | 7/1990 |
| JP | 05-167073 A | | 7/1993 |
| JP | 06-195977 A | | 7/1994 |
| JP | 2766056 B2 | | 4/1998 |
| JP | 2011-192373 A | | 9/2011 |
| JP | 2011-205092 A | | 10/2011 |
| JP | 2012-230754 A | | 11/2012 |
| JP | 2012-230755 A | | 11/2012 |

OTHER PUBLICATIONS

French Search Report, FR 1153573, dated Nov. 3, 2011.

* cited by examiner

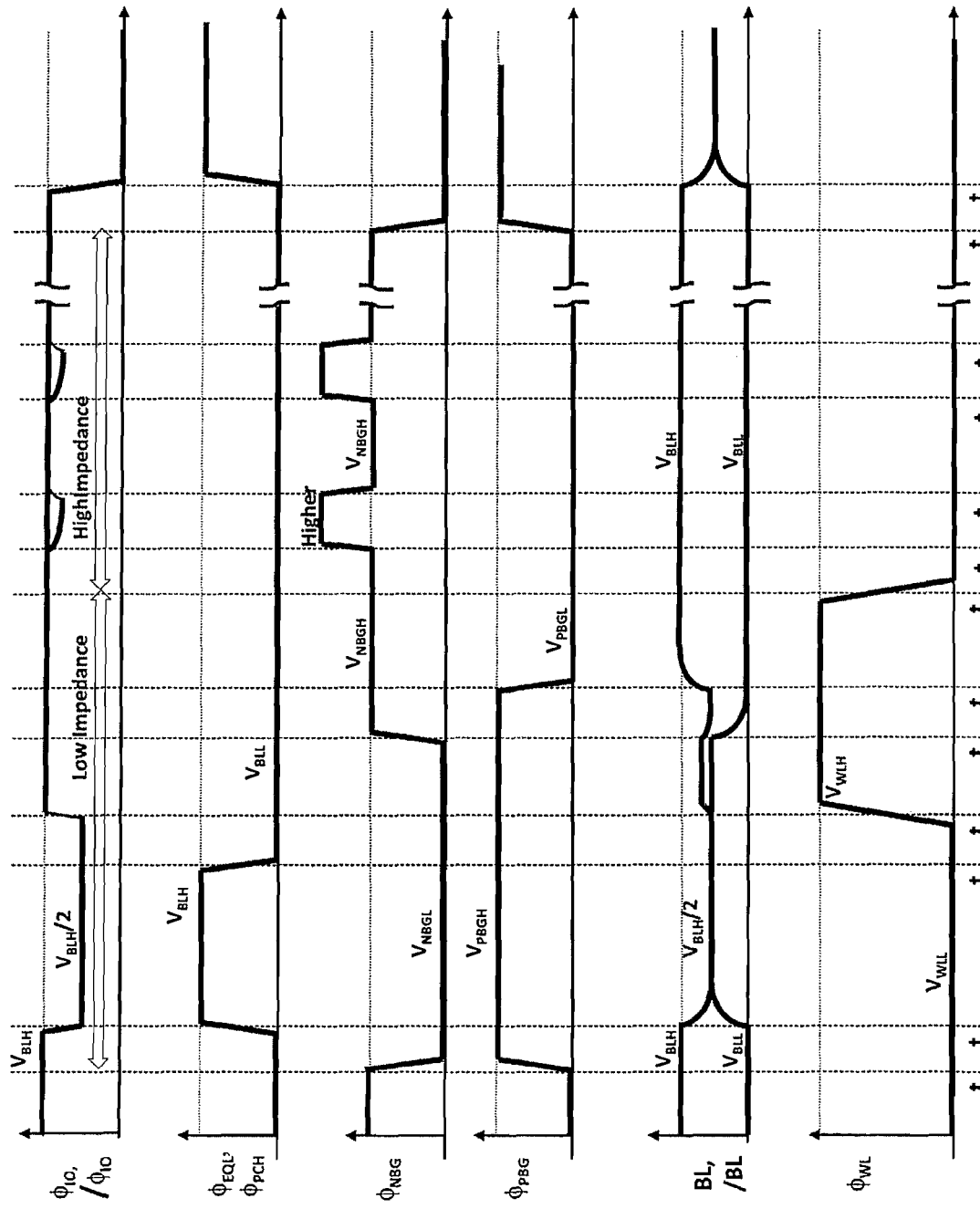

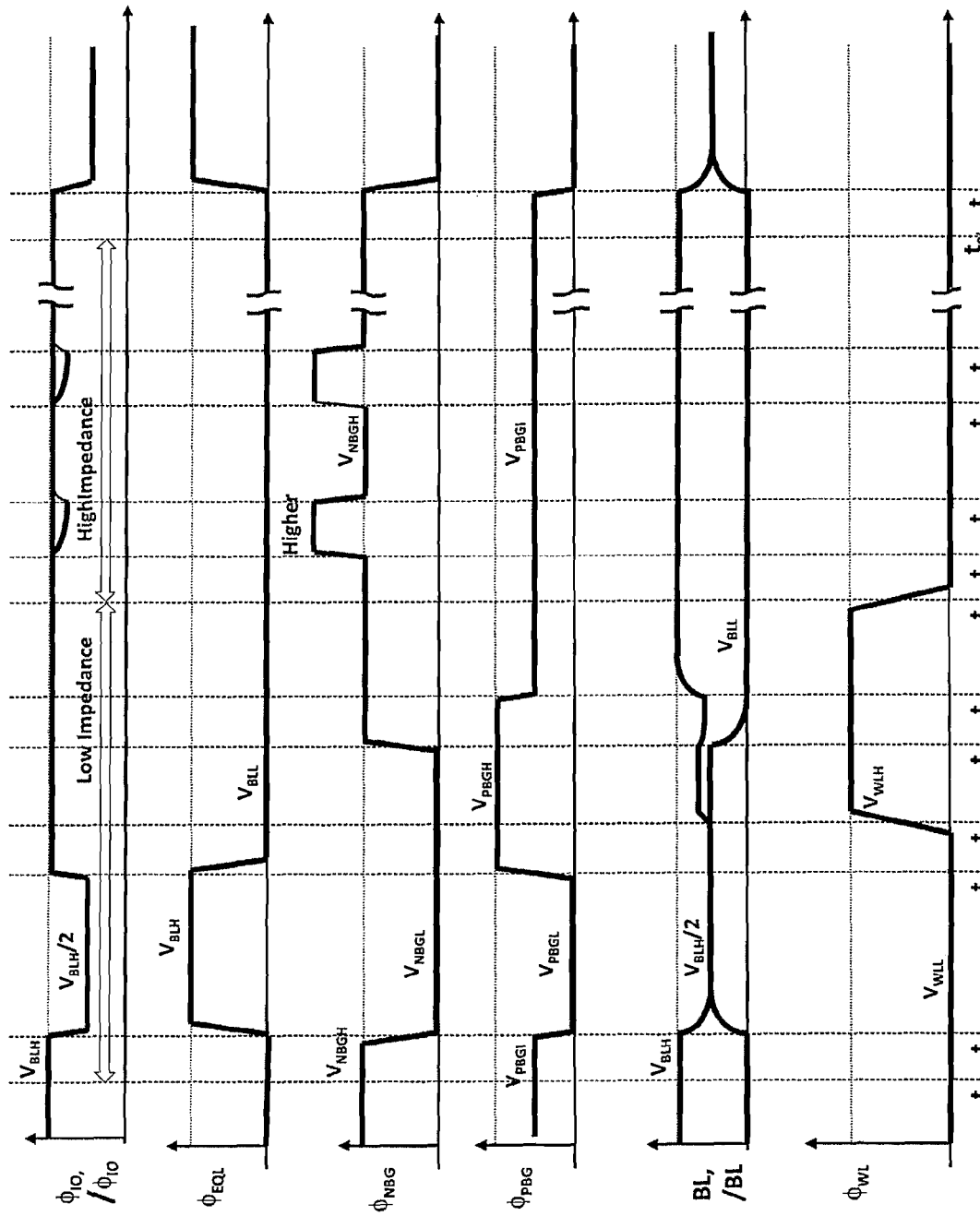

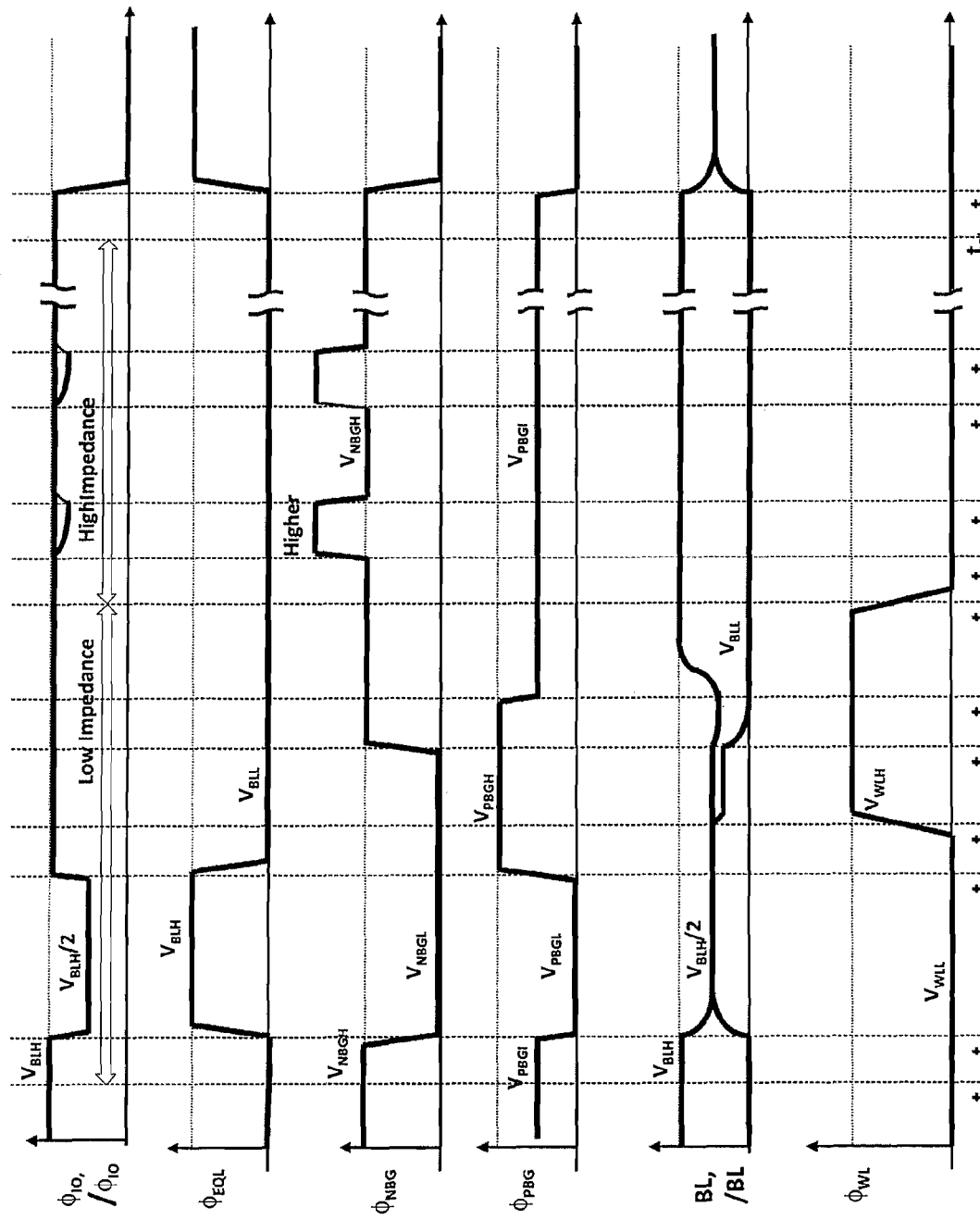

DIFFERENTIAL SENSE AMPLIFIER WITHOUT DEDICATED PASS-GATE TRANSISTORS

CROSS-REFERENCE TO RELATED APPLICATIONS

This application is related to U.S. patent application Ser. No. 13/456,020, entitled "Differential Sense Amplifier without Switch Transistors," which was filed on Apr. 25, 2012.

FIELD OF THE INVENTION

The invention generally relates to semiconductor memories, and more particularly to a sense amplifier for sensing data stored in a plurality of memory cells of a memory cell array.

BACKGROUND OF THE INVENTION

Semiconductor memories are used in computers, servers, handheld devices such as cell phones etc., printers, and many other electronic devices and applications. A semiconductor memory comprises a plurality of memory cells in a memory array, each memory cell storing at least a bit of information. Dynamic Random Access Memories (DRAMs) are an example of such semiconductor memories. The present invention is preferably embodied with DRAMs. As a consequence, the following description is done with reference to a DRAM as a non limiting example.

A sense amplifier is used to address a plurality of memory cells via a line, a so-called bit line. The conventional sense amplifier is more specifically a differential amplifier operating with a bit line and a complementary bit line which is used as a reference line, to detect and amplify the difference in voltage on the pair of bit lines.

As illustrated in FIG. 1, a conventional sense amplifier circuit comprises eleven transistors T21, T22, T31, T32, T10, T40, T50, T61, T62, T72, T71 fabricated in bulk silicon CMOS (complementary metal oxide semiconductor) technology.

A sense amplifier is used for sensing and writing-back data stored in memory cells, as well as reading the data and writing new data into the cells. A memory cell C is addressed by a word line WL that controls the gate of a cell access transistor Mc, the cell access transistor Mc connecting the cell C to a bit line BL. For reasons of simplicity, only one word line WL and one memory cell C are shown from the cell array on the left hand side of the sense amplifier.

A conventional sense amplifier generally comprises:
a first CMOS inverter having an output connected to the bit line BL and an input connected to the complementary bit line /BL, and
a second CMOS inverter having an output connected to the complementary bit line /BL and an input connected to the bit line BL.

Each CMOS inverter comprises:
a pull-up transistor T21, T22 having a drain and a source, and
a pull-down transistor T31, T32 having a drain and a source, with the pull-up transistor T21, T22 and the pull-down transistor T31, T32 of each CMOS inverter having a common drain.

The sources of the pull-down transistors T31, T32 are connected to a foot switch transistor T40, which is itself connected to a pull-down voltage source providing a low supply voltage $V_{Lsupply}$ usually at a low voltage level $V_{BLL}$ referred to as ground GND, and controlled by a foot switch control signal $\phi_{NSW}$. The ground level of the low supply voltage $V_{Lsupply}$ is used as a reference for the other voltage levels in the sense amplifier. In the circuit illustrated by FIG. 1, the foot switch transistor T40 is an N-MOS transistor. When the foot switch control signal $\phi_{NSW}$ is high, the foot switch transistor T40 is conducting, and the ground voltage is transmitted to the common source node of the pull-down transistors T31, T32. When the foot switch control signal $\phi_{NSW}$ is low, the foot switch transistor T40 is blocked and the common source node of the pull-down transistors T31, T32 is not pulled down.

The sources of the pull-up transistors T21, T22 are connected to a head switch transistor T10, which is itself connected to a pull-up voltage source providing a high supply voltage $V_{Hsupply}$, usually at a high voltage level $V_{BLH}$ such as VDD, and controlled by a head switch control signal $\phi_{NSW}$. In the circuit illustrated by FIG. 1, the head switch transistor T10 is a P-MOS (P-type metal-oxide-semiconductor) transistor. When the head switch control signal $\phi_{PSW}$ is low, the head switch transistor T10 is conducting and the high supply voltage $V_{Hsupply}$ is transmitted to the sources of the pull-up transistors T21, T22. When the control signal $\phi_{PSW}$ is high, the head switch transistor T10 is blocked and the common source node of the pull-up transistors T21, T22 is not pulled up, i.e., the voltage of the common source node of the pull-up transistors T21, T22 is floating.

When both head and foot switch transistors T10 and T40 are turned off, i.e., the head switch control signal $\phi_{PSW}$ is high and the foot switch control signal $\phi_{NSW}$ is low, all nodes in the sense amplifier are floating.

The sense amplifier further comprises a pair of dedicated precharge transistors T61, T62 respectively coupled to the bit line BL and to the complementary bit line /BL and arranged to precharge the bit lines BL, /BL to a precharge voltage $V_{PCH}$, usually at the mean value between the high supply voltage $V_{Hsupply}$ and the low supply voltage $V_{Lsupply}$. This mean value is usually half the high supply voltage $V_{Hsupply}$ high value, i.e., $V_{BLH}/2$, since the low voltage level GND of the low supply voltage $V_{Lsupply}$ is used as a reference for the other voltages and the high supply voltage $V_{Hsupply}$ and low supply voltage $V_{Lsupply}$ are usually then at their high and low voltage level, respectively. A precharge control signal $\phi_{PCH}$ is applied to the gates of the precharge transistors T61, T62.

The sense amplifier further comprises an equalization transistor T50 having its source/drain terminals respectively coupled to one of bit lines BL, /BL and having its gate controlled by an equalization control signal $\phi_{EQL}$. The equalization transistor T50 of the circuit illustrated in FIG. 1 is an N-MOS type transistor.

The sense amplifier further comprises two dedicated pass-gate transistors T71, T72, the gates of which are controlled by a decoding control signal $Y_{DEC}$. Each of the pass-gate transistors T71, T72 connects one of the bit lines BL, /BL to a global bit line IO, /IO, also called in-out line. The pass-gate transistors T71, T72 are used to transfer data between the bit lines BL, /BL and the global bit lines IO, /IO.

Although sense amplifiers are technically necessary, from an economical point of view the sense amplifiers can be considered as service circuits of the memory array and therefore as overhead that increases the area of the entire circuit and thus also its cost of fabrication.

Therefore, continuous efforts are made to minimize the area consumption of such sense amplifiers. The present invention now provides one solution to this problem.

SUMMARY OF THE INVENTION

The present invention relates to a simplified and robust memory sense amplifier.

According to a first aspect, a differential sense amplifier for sensing data stored in a plurality of memory cells of a memory cell array, including:
- a first CMOS inverter having an output connected to a first bit line and an input connected to a second bit line complementary to the first bit line, and
- a second CMOS inverter having an output connected to the second bit line and an input connected to the first bit line.

Each CMOS inverter comprises:
- a pull-up transistor having a drain and a source, and
- a pull-down transistor having a drain and a source, with the pull-up transistor and the pull-down transistor of each CMOS inverter having a common drain.

The sense amplifier also has a pair of pass-gate transistors arranged to connect the first and second bit lines to a first and a second global bit lines, respectively, so as to transfer data between the first and the second bit lines and the first and the second global bit lines, respectively, wherein the pass-gate transistors are constituted by the pull-up transistors or the pull-down transistors.

Other preferred, although non limitative, aspects of this sense amplifier are as follows:
- the pull-up and the pull-down (M31, M32) transistors are multigate transistors having at least a first control gate and a second control gate, and wherein
- the second control gates of the pull-up transistors are driven by a pull-up second control signal,
- the second control gates of the pull-down transistors are driven by a pull-down second control signal;
- the differential sense amplifier is made on a semiconductor-on-insulator substrate comprising a thin layer of semiconducting material isolated from a base substrate by an insulating layer, and wherein the second control gates are back control gates formed in the base substrate below the insulating layer; or
- the transistors are FinFET devices with independent double gates;
- the sense amplifier further comprises an equalization transistor having a source and a drain respectively coupled to one of the first and second bit lines;
- the equalization transistor is a multigate transistor having at least a first control gate and a second control gate connected together;
- the equalization transistor is a P-MOS type transistor physically arranged between the pull-up transistors;
- the sense amplifier has a pair of precharge transistors arranged to be respectively coupled to the first and second bit lines, so as to precharge the first and second bit lines to a precharge voltage, wherein the precharge transistors are constituted by the pull-up transistors or by the pull-down transistors;
- the pass-gate transistors are constituted by the pull-up transistors, and the sources of the pull-down transistors are electrically coupled and connected to a pull-down voltage source, without an intermediate transistor between the sources of the pull-down transistors and the pull-down voltage source; or
- the pass-gate transistors are constituted by the pull-down transistors, and the sources of the pull-up transistors are electrically coupled and connected to a pull-up voltage source, without an intermediate transistor between the sources of the pull-up transistors and the pull-up voltage source;
- the sense amplifier further comprises a pair of precharge transistors wherein the precharge transistors are multi-gate transistors having at least a first control gate and a second control gate connected together.

According to a second aspect, the invention relates to a method for controlling a differential sense amplifier according the first aspect of the invention, the sense amplifier being controlled to perform operations for pre-charging the bit lines, sensing and writing-back data stored in a plurality of memory cells of a memory cell array, wherein to modify the operation performed by the differential sense amplifier, the pull-up second control signal and/or the pull-down second control voltage are modified.

Other preferred, although non limitative, aspects of the method are as follows:
- during a precharge operation, a low pull-up second control signal is applied to the second control gates of the pull-up transistors so that the pull-up transistors are conducting and a low pull-down second control signal is applied to the second control gates of the pull-down transistors so that the pull-down transistors are not conducting; or
- during a precharge operation, a high pull-up second control signal is applied to the second control gates of the pull-up transistors so that the pull-up transistors are not conducting and a high pull-down second control signal is applied to the second control gates of the pull-down transistors so that the pull-down transistors are conducting;
- during a sensing operation, a high pull-down second control signal is applied to the second control gates of the pull-down transistors so that the pull-down transistors are conducting and a high pull-up second control signal is applied to the second control gates of the pull-up transistors so that the pull-up transistors are not conducting; or
- during a sensing operation, a low pull-down second control signal is applied to the second control gates of the pull-down transistors so that the pull-down transistors are not conducting and a low pull-up second control signal is applied to the second control gates of the pull-up transistors so that the pull-up transistors are conducting;
- during a write back operation, a low pull-up second control signal is applied to the second control gates of the pull-up transistors so that the pull-up transistors are conducting and a high pull-down second control signal is applied to the second control gates of the pull-down transistors so that the pull-down transistors are conducting;
- to perform a read operation, a high pull-down second control signal is applied to the second control gates of the pull-down transistors so as to turn the pull-down transistors into depletion mode; or
- to perform a read operation, a low pull-up second control signal is applied to the second control gates of the pull-up transistors so as to turn the pull-up transistors into depletion mode.

According to a third aspect, the invention relates to a semiconductor memory incorporating a memory cell array comprising at least one differential sense amplifier according to the first aspect of the invention.

BRIEF DESCRIPTION OF THE DRAWINGS

Other aspects and advantages of the present invention will become better apparent upon reading the following detailed description of preferred embodiments thereof, given as non-limiting examples, and made with reference to the appended drawings wherein:

FIGS. 4a and 4b illustrate signals that are applied to or generated within a sense amplifier according to the first embodiment;

FIGS. 6a and 6b illustrate signals that are applied to or generated within a sense amplifier according to the second embodiment;

DETAILED DESCRIPTION OF THE INVENTION

Figure 1:
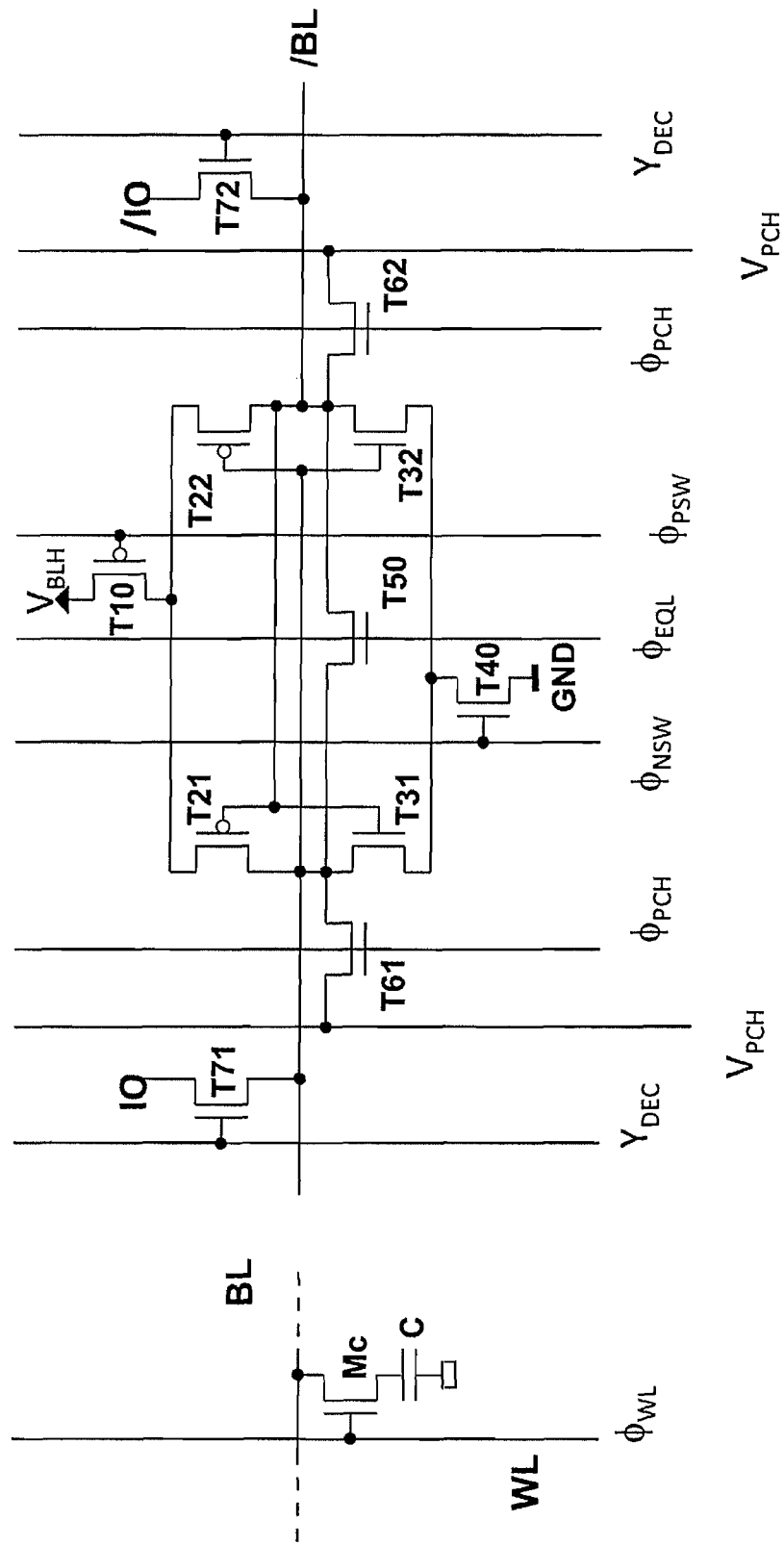
FIG. 1 is a circuit diagram of a sense amplifier of the prior art.
Figure 2A:
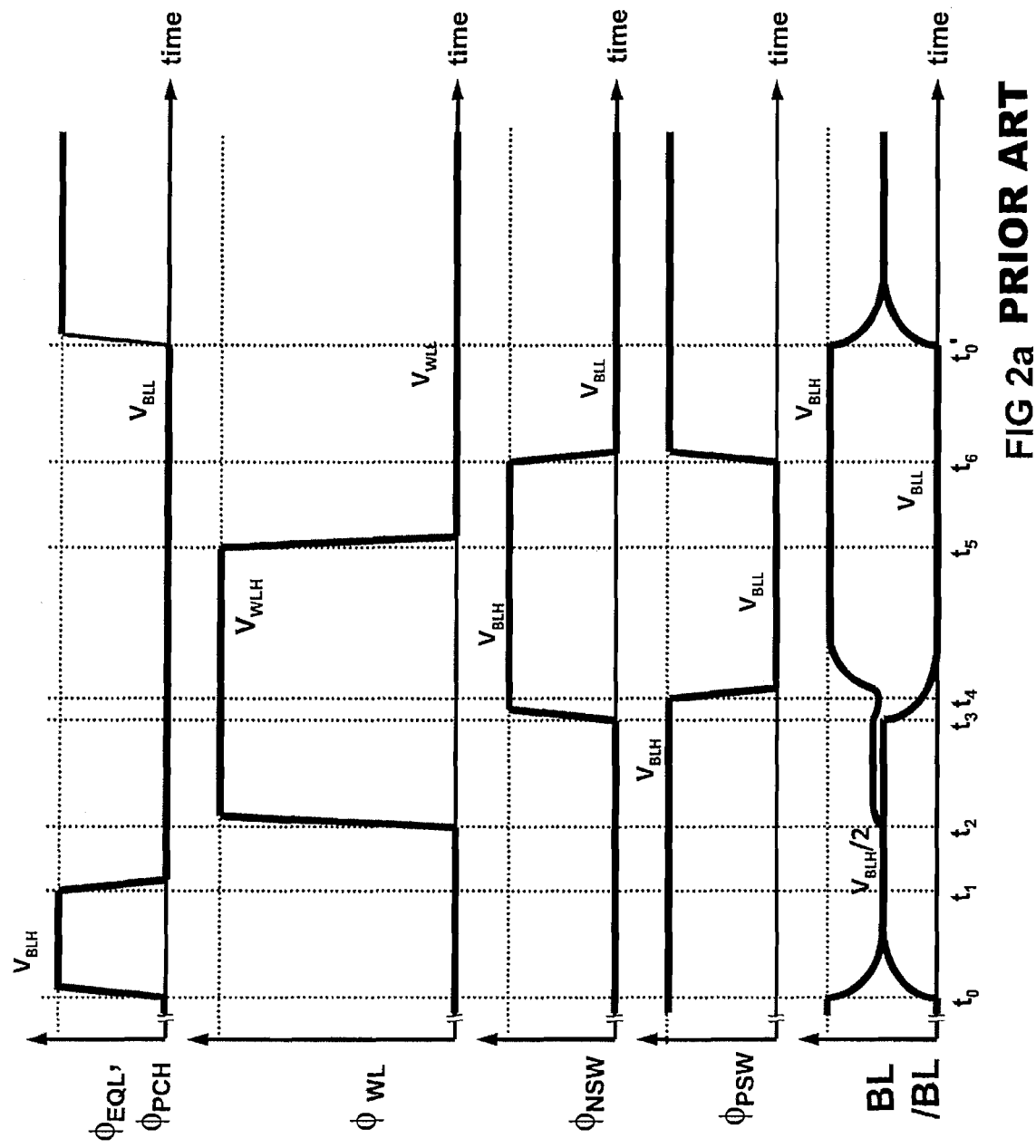
FIGS. 2a and 2b illustrate signals that are applied to or generated within a sense amplifier of the prior art.
Figure 2B:
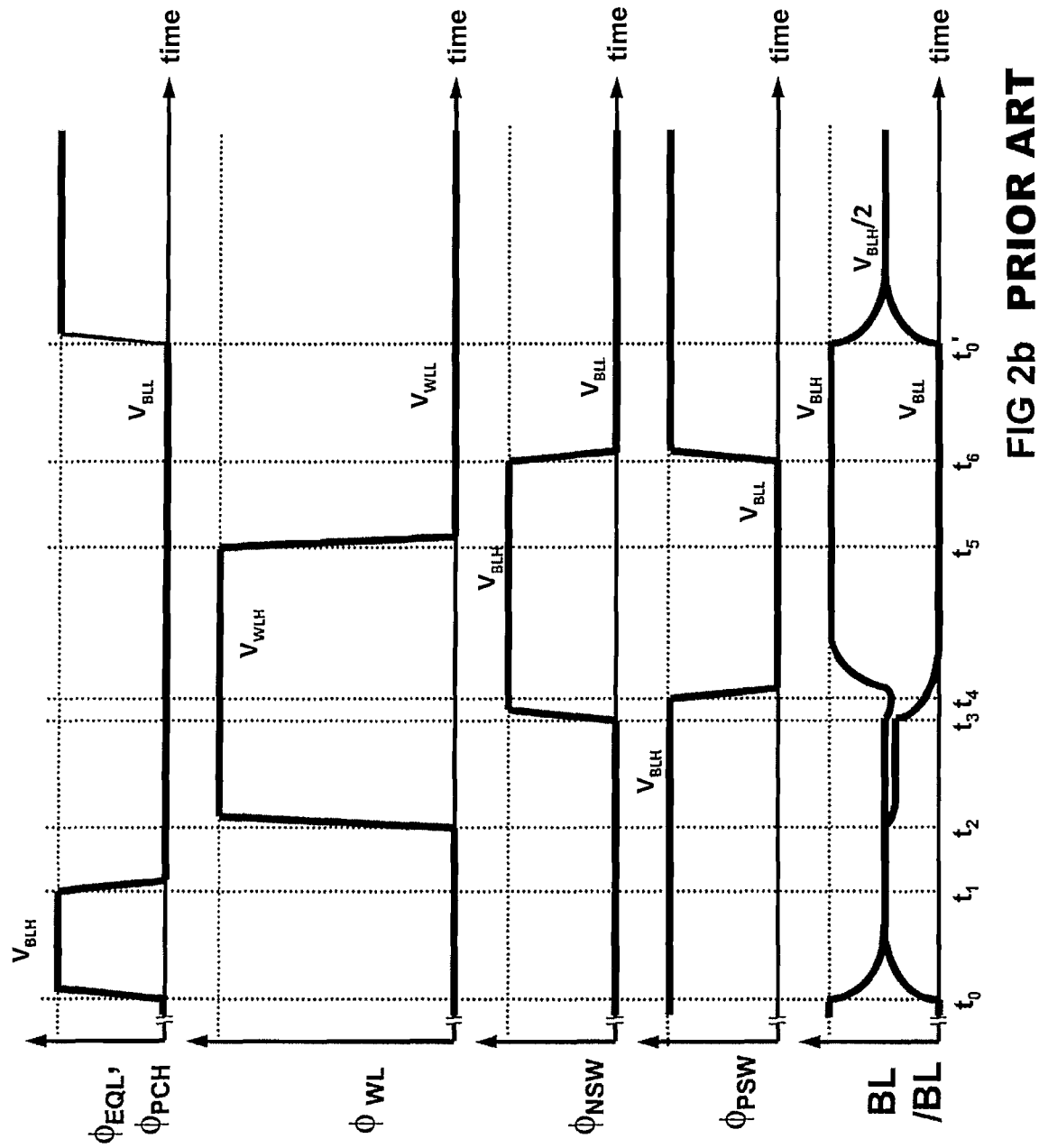

The operating process of a prior art sense amplifier as illustrated in FIG. 1 is now further described. Some signals that are applied to or generated within the circuit when a sense amplifier of the prior art is operated are illustrated by FIGS. 2a and 2b. The depicted timing is purely illustrative.

The first operation before reading out a memory cell is equalization and precharge. The sense amplifier is first turned off by setting the head switch control signal $\phi_{PSW}$ to a high voltage level and the foot switch control signal $\phi_{NSW}$ to a low voltage level. All internal nodes of the sense amplifier become floating. Prior to this operation, i.e., before time $t_0$, the sense amplifier was operated in a latched state providing complementary high and low supply voltages on the bit line BL and the complementary bit line /BL, depending on the previous operation.

Equalization is performed by applying a high voltage level to the equalization control signal $\phi_{EQL}$ to turn on the equalization transistor T50, thereby shorting the bit lines BL, /BL and setting their voltage levels at the mean value $V_{BLH}/2$. At the same time, the precharge transistors T61, T62 are turned on through the precharge control signal $\phi_{PCH}$. In this example, the precharge transistors T61, T62 are N-MOS type transistors; hence the precharge transistors T61, T62 are turned on by applying a high voltage level to the precharge control signal $\phi_{PCH}$. The precharge voltage $V_{PCH}$ is $V_{BLH}/2$ here.

The related time interval corresponding to the equalization and precharge operations is given by $t_0<t<t_1$ in FIGS. 2a and 2b.

The precharge operation compensates for possible leakages or unbalances which may result in a small deviation between the precharge voltage $V_{BLH}/2$ and the voltage achieved at the bit lines BL, /BL through equalization.

After equalization and precharge are completed, the precharge transistors T61, T62 and the equalization transistor T50 are turned off, corresponding to time $t_1$ in FIGS. 2a and 2b.

The voltage of wordline WL is switched to a high level $V_{WLH}$ so as to activate the cell access transistor Mc. The memory cell C and the bit line BL share their charges. A variation of the voltage appears on both the cell capacitor and the bit line BL resulting in a voltage difference between the voltages of the bit lines BL, /BL. The value of this variation compared to the reference voltage on the complementary bit line /BL is given by the equation:

$$\Delta V = V_{BL} - V_{/BL} = (C_{CELL}/\Sigma C)*(V_{CELL} - V_{BLH}/2)$$

In this equation, $V_{CELL}$ is the voltage stored on the memory capacitor and $\Sigma C = C_{CELL} + C_{BL} + C_{in,SA}$ corresponds to the sum of the capacitances of the cell C, of the bit line BL, and of the input capacitance of the sense amplifier $C_{in,SA}$. This voltage variation is also a voltage difference between the bit lines BL, /BL.

Depending on whether the data initially stored in the cell C is a logic "one" or a logic "zero", this voltage variation $\Delta V$ is positive or negative, respectively. The related time interval corresponds to $t_2<t<t_3$ in FIGS. 2a and 2b.

If a logic "one" was stored within the cell C, i.e., the voltage initially stored within the cell C is the high supply voltage $V_{Hsupply}$, the voltage of the bit line BL is slightly increased and the voltage variation $\Delta V$ becomes positive. This situation is illustrated by FIG. 2a. If a logic "zero" was stored within the cell C, i.e., the voltage initially stored within the cell C is $V_{BLL}$ or GND, the voltage of the bit line BL is slightly decreased and the voltage variation $\Delta V$ becomes negative. This situation is illustrated by FIG. 2b.

At time $t_3$, the sensing operation is started by raising the foot switch control signal $\phi_{NSW}$ to a high voltage level so as to turn on the foot switch transistor T40. The common source node of the pull-down transistors T31, T32 is thereby pulled down to the low supply voltage $V_{Lsupply}$ of the pull-down voltage source. As the voltages on the bit lines BL, /BL are respectively set to $V_{BLH}/2+\Delta V$ and $V_{BLH}/2$, and as these voltages are applied to the gates of the pull-down transistors T31, T32, the pull-down transistors T31, T32 are thus turned on.

The cross-coupled connection of the two pull-down transistors T31, T32 gives a higher gate voltage to the transistor with the lower drain voltage and vice versa. A higher gate voltage sinks more current into the related transistor and pulls down faster the corresponding drain voltage that was already lower than the other one. The voltage difference between the two bit lines BL, /BL is thus amplified. The related time interval corresponds to $t_3<t<t_4$ in FIGS. 2a and 2b.

At time $t_4$, in order to saturate the already amplified difference signal to the full high supply voltage $V_{Hsupply}$, the head switch transistor T10 is turned on through the head switch control signal $\phi_{PSW}$, thereby pulling up the common source of the pull-up transistors T21, T22 towards the high supply voltage $V_{Hsupply}$ of the pull-up voltage source. In the same manner as for the pull down transistors T31, T32, the cross-coupled connection of the pull-up transistors T21, T22 gives a higher gate overdrive voltage (in absolute value) to the transistor with the lower absolute drain-to-source voltage and vice versa. The process is comparable to the one described for the pull-down transistors T31, T32, but here a pull-up process is obtained resulting in a larger voltage difference between the two bit lines BL, /BL.

The combination of both the N channel transistors related pull down process and the P channel transistors related pull up process, leads to an amplification of the voltage difference between the bit lines BL, /BL until full CMOS voltage levels are reached.

In the case depicted in FIG. 2a where a logic "one" is stored within the cell C, the voltage difference between the bit lines BL, /BL resulting from the initial positive voltage variation $\Delta V$ is amplified until saturation is reached, so that the voltage of BL equals the high supply voltage $V_{Hsupply}$ while the voltage of the complementary bit line /BL is pulled down to the low supply voltage $V_{Lsupply}$. In the case depicted in FIG. 2b where a logic "zero" is stored in the cell C, the voltage difference between the bit lines BL, /BL resulting from the initial negative voltage variation ΔV is amplified so that the voltage of the bit lines BL, /BL finally stabilize with the voltage of the bit line BL at the level of the low supply voltage $V_{Lsupply}$, and the voltage of the complementary bit line /BL at the level of the high supply voltage $V_{Hsupply}$.

The content of the cell C is then restored to its initial value as the word line WL is still activated. The two bit lines BL and /BL are saturated at CMOS voltage levels, avoiding any current through the sense amplifier. These CMOS levels can be easily transferred later to the global bit Lines IO, /IO through the pass gate transistors T71, T72 by rendering the pass gate transistors T71, T72 conducting by means of the decoding signal $Y_{DEC}$. As can be seen in FIGS. 2a and 2b, the related time interval corresponds to $t_4 < t < t_5$.

At time $t_5$, in order to retain the data in the cell C, the cell access transistor Mc is turned off by deactivating the word line WL, i.e., by applying a low voltage level to the select signal $\phi_{WL}$.

At time $t_6$, the foot switch transistor T40 is turned off by setting the foot switch control signal $\phi_{NSW}$ to a low voltage level, thereby isolating the common source node of the pull-down transistors T31, T32 from the pull-down voltage source.

Simultaneously, the head switch transistor T10 is also turned off by setting the head switch control signal $\phi_{PSW}$ at a high voltage level, thereby isolating the common source node of the pull-up transistors T21, T22 from the pull-up voltage source. The pull-up and pull-down transistors T31, T32, T21, T22 are thus deactivated.

At time $t_0'$, a new cycle begins with the precharge and equalization operations as described above.

In order to write data into the cell C or to read the data stored in cell C, a high voltage level decoding control signal $Y_{DEC}$ is applied to the gates of the pass gate transistors T71, T72 so as to turn them on.

Two embodiments of a sense amplifier according to the first aspect of the invention and their associated operating process when controlled by a method in accordance with the second aspect of the invention are described hereafter.

First Embodiment

Figure 3:
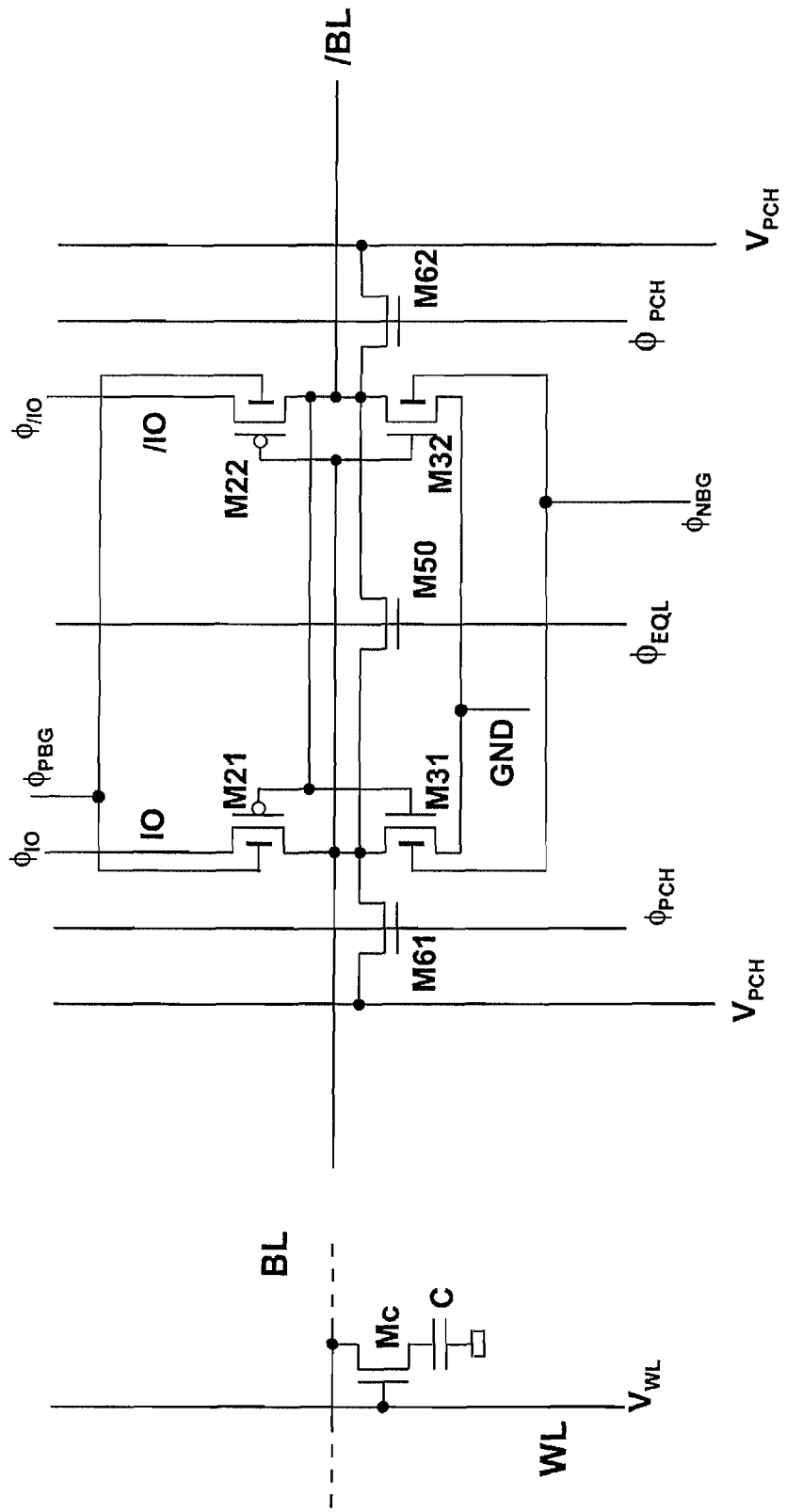
FIG. 3 is a circuit diagram of a sense amplifier in accordance with a first embodiment of the first aspect of the invention.

As illustrated in FIG. 3, a sense amplifier according to the first embodiment of the invention includes four transistors M21, M22, M31, M32 for the inverters, with two additional precharge transistors M61, M62 and one additional equalization transistor M50.

As for FIG. 1 illustrating a prior art sense amplifier, and for simplicity's sake, only one word line WL and one memory cell C are shown on the left hand side of the sense amplifier. The cell C is addressed by the word line WL that controls the gate of a cell access transistor Mc, the cell access transistor Mc connecting the memory cell C to a bit line.

The differential sense amplifier for sensing data stored in a plurality of memory cells C of a memory cell array according to the first embodiment comprises:
a first CMOS inverter having an output connected to a first bit line BL and an input connected to a second bit line /BL complementary to the first bit line BL,
a second CMOS inverter having an output connected to the second bit line /BL and an input connected to the first bit line BL.
Each CMOS inverter comprises:
a pull-up transistor M21, M22 having a drain and a source, and
a pull-down transistor M31, M32 having a drain and a source, with the pull-up transistor M21, M22 and the pull-down transistor M31, M32 of each CMOS inverter having a common drain.

In the depicted embodiment of FIG. 3, the pull-up transistors M21, M22 are P-MOS type transistors and the pull-down transistors M31, M32 are N-MOS type transistors.

Differing from the prior art sense amplifier described above, the pull-up transistors M21, M22 and the pull-down transistors M31, M32 are multigate transistors, having at least a first control gate and a second control gate capable of being biased in order to modulate the threshold voltage of the transistor with respect to the first control gate. For example, the first control gate may be a front control gate and the second control gate may be a back control gate.

Whereas the transistors of the prior art sense amplifier are fabricated in bulk silicon CMOS technology, the transistors of the sense amplifier according to the invention are preferably fabricated in Semiconductor-On-Insulator (SeOI) technology.

SeOI transistors have a lower random threshold voltage mismatch compared to bulk CMOS fabricated transistors. Random threshold voltage mismatch mainly results from a voltage deviation proportional to the square root of the active area of the transistor. Thus, the use of SeOI transistors allows the dimensions of the transistors to be smaller than bulk-based transistors while having an acceptable random threshold voltage mismatch. The resulting sense amplifier consumes less area compared to its classical bulk-based counterpart. Moreover, the size of interconnects can be reduced thanks to smaller transistors.

In a preferred embodiment, the differential sense amplifier is made on a semiconductor-on-insulator substrate, for instance a silicon-on-insulator substrate, comprising a thin layer of semiconducting material isolated from a base substrate by an insulating layer. The first control gates are front control gates and the second control gates are back control gates formed in the base substrate below the insulating layer. The transistors may be fully depleted (FD) SOI transistors.

Alternatively, the transistors of the sense amplifier are Fin-FET-type transistors with independent double gates. A Fin-FET-type transistor consists of a thin fin which forms the active channel and surrounding control electrodes which form the gates of the transistor.

As a non limiting illustration, in the following description, it will be referred to pull-up and pull-down transistors each having a front control gate and a back control gate. As a consequence, the first control gate of each pull-up and pull-down transistor is a front control gate, and the second control gate of each pull-up and pull-down transistor is a back control gate. Accordingly, the pull-up second control signal is a pull-up back gate control signal and the pull-down second control signal is a pull-down back gate control signal.

Referring now to FIG. 3, the back control gates of the pull-up transistors M21, M22 are connected to a common pull-up back control gate on which a pull-up back gate control signal $\phi_{PBG}$ is applied. The pull-up back gate control signal $\phi_{PBG}$ can take voltage values within a range comprised between a low voltage level $V_{PBGL}$ and a high voltage level $V_{PBGH}$.

The back control gates of the pull-down transistors M31, M32 are connected to a common pull-down back control gate to which a pull-down back gate control signal $\phi_{NBG}$ is applied. The pull-down back gate control signal $\phi_{NBG}$ can take voltage values within a range comprised between a low voltage level $V_{NBGL}$ and a voltage higher than a high voltage level $V_{NBGH}$.

The sense amplifier further comprises a pair of precharge transistors M61, M62 coupled to the first bit line BL and to the second bit line /BL, respectively, and arranged to precharge the first and second bit line BL, /BL to a precharge voltage $V_{PCH}$ usually at the mean value between the high supply voltage $V_{Hsupply}$ and the low supply voltage $V_{Lsupply}$. This mean value is usually half the high supply voltage $V_{Hsupply}$ high value, i.e., $V_{BLH}/2$, since the low voltage level $V_{BLL}$ of the low supply voltage $V_{Lsupply}$ is used as a reference for the other voltages, i.e., $V_{BLL}=0$, and the high supply voltage $V_{Hsupply}$ and the low supply voltage $V_{Lsupply}$ are usually then at their high and low voltage level, respectively. A precharge control signal $\phi_{PCH}$ is applied to the gates of the precharge transistors M61, M62.

A sense amplifier must be turned off to avoid any conflict between the normal sensing operation and the equalization and precharge operations themselves. This is performed within state-of-the-art sense amplifiers by turning off the head and foot switch transistors T10, T40.

According to the invention, the switch transistors T10, T40 of FIG. 1 are omitted and the sense amplifier turning off operation is performed by raising the threshold voltages (in absolute values for the P channels) of the pull-up and pull-down transistors M21, M22, M31, M32 so that the transistors are not in a conducting state for the voltages applied during the precharge operation. The threshold voltages of the pull-up and pull-down transistors M21, M22, M31, M32 with respect to their front control gates are raised by means of their respective back control gates. Under such conditions, all four transistors are switched off, i.e., rendered blocking, for all possible combinations of voltages on the bit lines BL and /BL.

It shall be noted that it is possible to suppress only one of the switch transistors T10, T40, although both switch transistors are preferably omitted. The invention is described accordingly.

The sources of the pull-up transistors M21, M22 are respectively directly connected to a first and a second global bit lines IO, /IO acting as a pull-up voltage source, without an intermediate transistor between the sources of the pull-up transistors M21, M22 and the global bit lines IO, /IO. Compared with the afore-described prior art sense amplifier, the head switch transistor T10 is omitted, thereby resulting in a more area efficient sense amplifier.

The sources of the pull-down transistors M31, M32 are directly connected to a pull-down voltage source providing a low supply voltage $V_{Lsupply}$, without an intermediate transistor between the sources of the pull-down transistors M31, M32 and the pull-down voltage source. Comparing with the afore-described prior art sense amplifier, the foot switch transistor T40 is omitted, thereby resulting in a more area efficient sense amplifier.

Further, two transistors instead of four transistors are connected in series between the pull-up voltage source and the pull-down voltage source, thereby relaxing the constraints in terms of voltage relationships.

The equalization can occur through the equalization transistor M50 as described on the state-of-the-art circuit. In order to compensate possible leakages or unbalances which may result in a small deviation between the precharge voltage and the voltage achieved at the bit lines BL, /BL through equalization, a precharge operation is also performed through the precharge transistors M61 and M62 like on the state-of-the-art circuit described before. Compared to a prior art sense amplifier, the read operation is performed by the pull-up transistors M21, M22 or by the pull-down transistors M31, M32. Hence the pass-gate transistors are constituted by the pull-up transistors M21, M22 or by the pull-down transistors M31, M32. Dedicated pass-gate transistors T71, T72 as shown in FIG. 1 are thus omitted in this second embodiment, so is the corresponding decoding control signal $Y_{DEC}$. The pass-gate transistors constituted by the pull-up transistors M21, M22 or by the pull-down transistors M31, M32 are arranged to connect the first and second bit lines BL, /BL to the first and second global bit lines IO, /IO, so as to transfer data between the first and the second bit lines (BL, /BL) and the first and the second global bit lines IO, /IO, respectively.

Further, since the pass-gate transistors are preferably the pull-up transistors M21, M22, the second embodiment is described with the pull-up transistors M21, M22 as pass-gates transistors and thus connected to the global bit lines IO, /IO.

It shall be noted that should the pass-gates transistors be constituted by the pull-down transistors M31, M32, the pull-down transistors M31, M32 would be connected to the global bit lines IO, /IO instead.

The global bit lines IO, /IO are connected to a further signal processing circuit (not shown), usually referred to as a secondary sense amplifier (SSA), for processing the data. The secondary sense amplifier is in particular used for detecting and exploiting a differential signal generated on the global bit lines IO, /IO during read operations.

The equalization transistor M50 and the precharge transistors M61, M62 in FIG. 3 are not explicitly shown as 501 device with back control gates. Being part of an 501 integrated circuit, they are preferably realized as 501 transistors as well. They can be multigate transistors having at least a first control gate and a second control gate capable of being biased in order to modulate the threshold voltage of the transistor with respect to their first control gate.

The equalization transistor M50 and the precharge transistors M61, M62 can be made on a semiconductor-on-insulator substrate comprising a thin layer of semiconducting material isolated from a base substrate by an insulating layer, wherein the second control gates are back control gates formed in the base substrate below the insulating layer.

Their respective back control voltages are then chosen at values that allow their operations to be performed. Optionally, their respective back control gates and their respective front control gates may also be connected together to achieve increased transconductance, resulting in faster equalization and precharge for the sense amplifier.

Figure 4B:
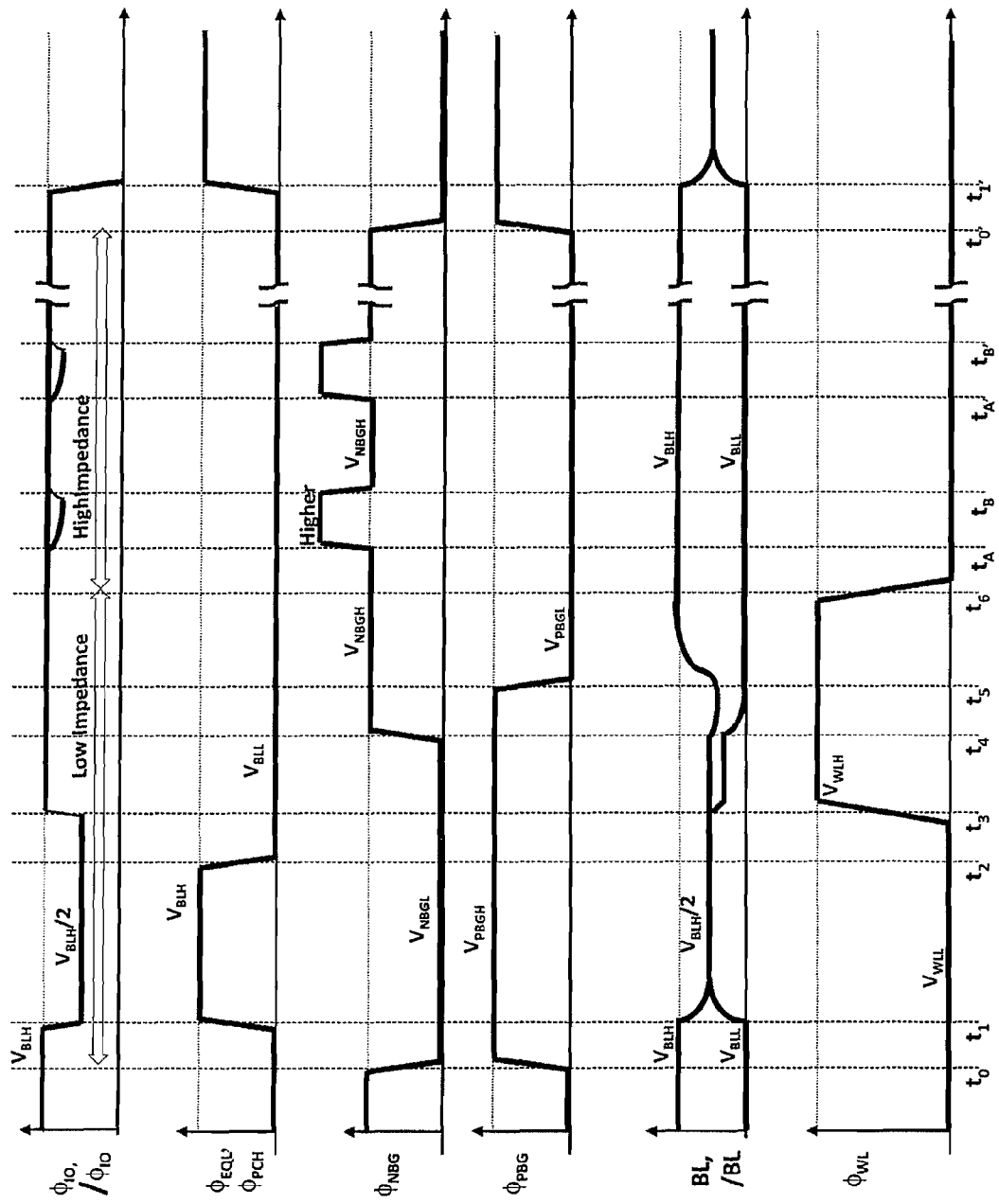

Operating Process of a Sense Amplifier without Switch Transistors and No Dedicated Pass-Gates Transistors The operating process of a sense amplifier as illustrated in FIG. 3 is now described. Signals that are applied to or generated within the sense amplifier are illustrated by FIGS. 4a and 4b. The depicted timing is purely illustrative.

As the function is built of complementary N-MOS and P-MOS transistors, all subfunctions of the sense amplifier can be swapped from the N-MOS to P-MOS side and vice versa. For instance it is possible to precharge or equilibrate the bit lines BL, /BL with P channel devices, or with N channel devices. Sensing may also be performed by the pull-up transistors M21, M22 or by the pull-down transistors M31, M32. In the illustrated process, sensing occurs through the pull-down transistors M31, M32 connected to the low pull-down voltage source providing a low supply voltage $V_{Lsupply}$.

Before time $t_0$, the sense amplifier is operated in a latched state providing complementary high and low supply voltages to the first and second bit lines BL, /BL, depending on the previous operation.

At time $t_0$, the pull-up back gate control signal $\phi_{PBG}$ is raised to high voltage level $V_{PBGH}$ so that the pull-up transistors M21, M22 are turned off. Simultaneously, the pull-down back gate control signal $\phi_{NBG}$ is lowered to a low voltage level $V_{NBGL}$ so as to turn off the pull-down transistors M31, M32.

At time $t_0$, the pull-up back gate control signal $\phi_{PBG}$ is raised to high voltage level $V_{PBGH}$ so that the pull-up transistors M21, M22 are turned off. Simultaneously, the pull-down back gate control signal $\phi_{NBG}$ is lowered to a low voltage level $V_{NBGL}$ so as to turn off the pull-down transistors M31, M32.

At time $t_1$, equalization is performed by applying a high voltage level to the equalization control signal $\phi_{EQL}$ to turn on the equalization transistor M50, thereby shorting the bit lines BL, /BL and setting their voltage levels at the mean value $V_{BLH}/2$.

At the same time, the precharge transistors M61, M62 are turned on through the precharge control signal $\phi_{PCH}$. The bit lines BL, /BL are thereby connected to the precharge voltage $V_{PCH}$, set at $V_{BLH}/2$. The related time interval corresponds to $t_1 < t < t_2$ in FIGS. 4a and 4b. The precharge operation compensates for possible leakages or unbalances which may result in a small deviation between the desired precharge voltage $V_{PCH}$ at $V_{BLH}/2$ and the voltage achieved at the bit lines BL, /BL through equalization.

At time $t_2$, after equalization and precharge are completed, the equalization transistor M50 and precharge transistors M61, M62 are turned off by means of the equalization control signal $\phi_{WL}$ and the precharge control signal $\phi_{PCH}$, respectively.

At time $t_3$, the select signal $\phi_{WL}$ applied to the word line WL is set at a high level $V_{WLH}$ so as to activate the cell access transistor Mc. The memory cell C and the first bit line BL share their charges. A voltage variation $\Delta V$ appears on the first bit line BL, resulting in a voltage difference between the first bit line BL and the second bit line /BL. The value of this voltage variation $\Delta V$ depends on the data initially stored in the cell C in the same manner as previously described for the prior art circuit.

Depending on whether the data initially stored in the cell C is a logic "one" or a logic "zero", this voltage variation $\Delta V$ is positive or negative, respectively. The related time interval corresponds to $t_3 < t < t_4$ in FIGS. 4a and 4b.

If a logic "one" was stored within the cell C, i.e., the voltage initially stored within the cell C is the high supply voltage $V_{Hsupply}$, the voltage of the first bit line BL is slightly increased. This situation is illustrated by FIG. 4a. If a logic "zero" was stored within the cell C, i.e., the voltage initially stored within the cell C is the low supply voltage $V_{Lsupply}$, the voltage of the first bit line BL is slightly decreased. This situation is illustrated by FIG. 4b.

At time $t_4$, the pull-down back gate control signal $\phi_{NBG}$ is raised to a high voltage level $V_{NBGH}$ that turns on the two pull-down transistors M31, M32. The voltage difference is then amplified by the two pull-down transistors M31, M32 in a similar manner as in the case of the prior art sense amplifier using bulk CMOS technology. The related time interval corresponds to $t_4 < t < t_5$ in FIGS. 4a and 4b.

At time $t_5$, in order to saturate the already amplified difference signal to the full high voltage level $V_{BLH}$ of the high supply voltage $V_{Hsupply}$ provided by the pull-up voltage source, the pull-up back gate control signal $\phi_{PBG}$ is lowered to a low voltage level $V_{PBGL}$ turning on the pull-up transistors M21, M22.

The combination of the respective actions of the pull-down transistors M31, M32 and the pull-up transistors M21, M22 saturates the sense amplifier and sets the bit lines BL, /BL to the respective voltages of the pull-up voltage source and the pull-down voltage source according to the initial value of the voltage variation $\Delta V$ (positive or negative).

In the case depicted in FIG. 4a where a logic "one" is stored within the cell C, a positive initial voltage variation $\Delta V$ on the first bit line BL is amplified up to the saturation at the high supply voltage $V_{Hsupply}$ provided by the pull-up voltage source while the second bit line /BL is pulled down to the low supply voltage $V_{Lsupply}$ provided by the pull-down voltage source. In the case depicted in FIG. 4b where a logic "zero" is stored in the cell C, the initial negative voltage variation $\Delta V$ on the first bit line BL is pulled down to the low supply voltage $V_{Lsupply}$ provided by the pull-down voltage source while the second bit line /BL is saturated up to the high supply voltage $V_{Hsupply}$ provided by the pull-up voltage source.

The content of the cell C is then restored to its initial value as the word line WL is still activated. The data is hence written back into the memory cell C. The two bit lines BL and /BL are saturated at CMOS voltage levels, avoiding any current through the sense amplifier. As can be seen in FIGS. 4a and 4b, the related time interval corresponds to $t_5 < t < t_6$.

At time $t_6$, in order to retain the data in the cell C, the cell access transistor Mc is turned off by deactivating the word line WL, i.e., by setting the select signal $\phi_{WL}$ at a low voltage level $V_{WLL}$. The cell content is thus protected.

Also at time $t_6$, the two global bit lines IO, /IO are kept at a high voltage level, typically at or somewhat below $V_{BLH}$, but are turned to a higher impedance than their previous impedance, for example by means of the so-called secondary sense amplifier (not shown).

Two read operations performed by the sense amplifier are depicted by FIGS. 4a and 4b. The first read operation occurs between $t_A$ and $t_B$, the second read operation occurs between $t_A'$, and $t_B'$. However, the sense amplifier can perform read operations as many times as necessary.

At time $t_A$, after $t_6$, the pull-down back gate control signal $\phi_{NBG}$ is set to a voltage level higher than its previous high voltage level $V_{NBGH}$. This higher voltage level is able to turn both pull-down transistors M31, M32 to depletion mode.

Since one of the bit lines BL, /BL is at the high voltage $V_{BLH}$ of the pull-up voltage source constituted by the global bit lines IO, /IO, whereas the other bit line BL, /BL is at the low voltage $V_{BLL}$ of the low supply voltage $V_{Lsupply}$, one of the pull-up transistor M21, M22 has a low voltage level applied to its front gate whereas the other has a high voltage level applied to its front gate.

Since the pull-up transistors M21, M22 are in the enhancement mode, the pull-up transistor with a low voltage level on its front gate is in the on state, while the other pull-up transistor is in the off state.

If the voltage of the first bit line BL is at the high voltage level $V_{BLH}$, and the voltage of the second bit line /BL is at the low voltage level $V_{BLL}$, i.e., if the accessed cell stores a logic "one", the pull-up transistor M21 with its front gate connected to the second bit line /BL would be conducting and the other pull-up transistor M22 would be off.

If the voltage of the first bit line BL is at the low voltage level $V_{BLL}$ and the voltage of the second bit line /BL is at the high voltage level $V_{BLH}$, i.e., if the accessed cell stores a logic "zero", the pull-up transistor M22 with its front gate connected to the first bit line BL would be conducting and the other pull-up transistor M21 would be off.

With both pull-down transistors M31, M32 in depletion mode and one of the pull-up transistors M21, M22 in the on state, a current flows either through the first global bit line IO or the second bit line /IO, depending on which one of the pull-up transistors M21, M22 is conducting.

As illustrated by FIGS. 4a and 4b between $t_A$ and $t_B$ and between $t_A'$, and $t_B'$, this current generates a voltage drop associated with the global bit line through which the current flows. The voltage drop is detected by the secondary sense amplifier (not shown) and indicates the data stored in the memory cell C. If a logic "one" is stored in the cell C, the voltage drop is associated with first global bit line IO. If a logic "zero" is stored in the cell C, the voltage drop is associated with the second global bit line /IO.

An alternate solution where the differential signal is based on the current consists in keeping the first and second global bit lines IO, /IO at low impedance and in detecting the current flowing through the global bit lines.

After $t_0'$, at time $t_1'$, a new cycle starts by toggling the pull-down back gate control signal $\phi_{NBG}$ and the pull-up back gate control signal $\phi_{PBG}$ in order to turn off the sense amplifier. The global bit lines IO, /IO are turned to their initial low impedance. New equalization and precharge operations are started.

Writing data into the cell C is done by applying the desired signal to the global bit lines IO, /IO when the pull-up transistors M21, M22 are conducting, e.g. between $t_5$ and $t_6$. This can be during a dedicated cycle or within the previously described cycle.

As already mentioned, the sensing operation can be performed by the pull-up transistors M21, M22 instead of the pull-down transistors M31, M32. In that case, the following back gate control signal patterns are applied to the pull-down transistors M31, M32 and to the pull-up transistors M21, M22. During the sensing operation, i.e., between $t_4$ and $t_5$, the pull-up back gate control signal $\phi_{PBG}$ is set at a low voltage level so as to turn on the pull-up transistors M21, M22, while the pull-down back gate control signal $\phi_{NBG}$ is kept at a low voltage level so as to keep the pull-down transistors M31, M32 in the off state. The other operations are performed by the control signals already described.

As already mentioned, the pass-gate transistors can be the pull-down transistors M31, M32 instead of the pull-up transistors M21, M22. In that case, the following back gate control signal patterns are applied to the pull-down transistors M31, M32 and to the pull-up transistors M21, M22. During the read operations, i.e., between $t_4$ and $t_B$ or between $t_4'$ and $t_B'$, the pull-up back gate control signal $\phi_{PBG}$ is set to a voltage Level lower than its previous low voltage level $V_{NBGL}$. This lower voltage level is able to turn both pull-up transistors M21, M22 to depletion mode.

As the sources of the pull-down transistors M31, M32 are connected to the global bit lines IO, /IO, the global bit lines are usually at a low voltage level $V_{BLL}$ acting as the low supply voltage, and the differential signal associated with one of the global bit lines is detected and exploited by the secondary sense amplifier as previously described. The other operations are performed by the control signals already described.

Second Embodiment

Figure 5:
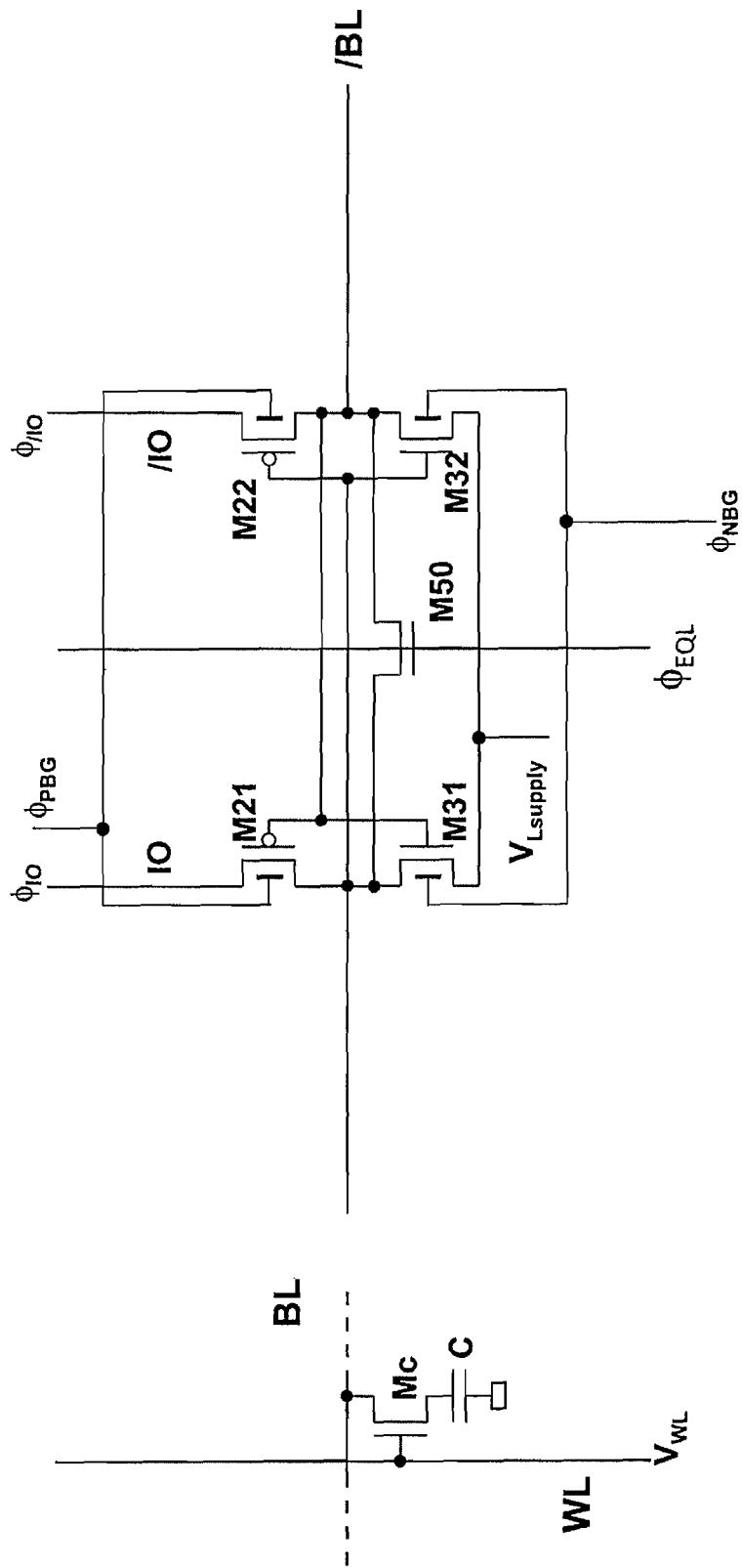
FIG. 5 is a circuit diagram of a sense amplifier in accordance with a second embodiment of the first aspect of the invention.

No Switch Transistors, No Dedicated Precharge Transistors and No Dedicated Pass-Gate Transistors As illustrated in FIG. 5, a sense amplifier according to the second embodiment of the invention includes four transistors M21, M22, M31, M32 for the inverters and one additional equalization transistor M50.

The sense amplifier of FIG. 5 comprises:
  a first CMOS inverter having an output connected to a first bit line BL and an input connected to a second bit line /BL complementary to the first bit line BL,
  a second CMOS inverter having an output connected to the second bit line /BL and an input connected to the first bit line BL.

Each CMOS inverter comprises:
  a pull-up transistor M21, M22 having a drain and a source, and
  a pull-down transistor M31, M32 having a drain and a source,
with the pull-up transistor M21, M22 and the pull-down transistor M31, M32 of each CMOS inverter having a common drain.

In the depicted embodiment of FIG. 5, the pull-up transistors M21, M22 are P-MOS type transistors and the pull-down transistors M31, M32 are N-MOS type transistors.

Differing from the sense amplifier of FIG. 1, the pull-up transistors M21, M22 and the pull-down transistors M31, M32 are multigate transistors, having at least a first and a second control gate capable of being biased in order to modulate the threshold voltage of the transistor with respect to the first control gate. For example, the first control gate may be a front control gate and the second control gate may be a back control gate.

Whereas the transistors of the prior art sense amplifier are fabricated in bulk silicon CMOS technology, the transistors of the sense amplifier according to the invention are preferably fabricated in Semiconductor-On-Insulator (SeOI) technology.

SeOI transistors have a lower random threshold voltage mismatch compared to bulk CMOS fabricated transistors. Random threshold voltage mismatch mainly results from a voltage deviation proportional to the square root of the active area of the transistor. Thus, the use of SeOI transistors allows the dimensions of the transistors to be smaller than bulk-based transistors while having an acceptable random threshold voltage mismatch. The resulting sense amplifier consumes less area compared to its classical bulk-based counterpart. Moreover, the size of interconnects can be reduced thanks to smaller transistors.

In a preferred embodiment, the differential sense amplifier is made on a semiconductor-on-insulator substrate, for instance a silicon-on-insulator substrate, comprising a thin layer of semiconducting material isolated from a base substrate by an insulating layer. The first control gates are front control gates and the second control gates are back control gates formed in the base substrate below the insulating layer. The transistors may be fully depleted (FD) 501 transistors.

Alternatively, the transistors of the sense amplifier are Fin-FET-type transistors with independent double gates. A Fin-FET-type transistor consists of a thin fin which forms the active channel and surrounding control electrodes which form the gates of the transistor.

As a non limiting illustration, in the following description, it will be referred to pull-up and pull-down transistors each having a front control gate and a back control gate. As a consequence, the first control gate of each pull-up and pull-down transistor is a front control gate, and the second control gate of each pull-up and pull-down transistor is a back control gate. Accordingly, the pull-up second control signal is a pull-up back gate control signal and the pull-down second control signal is a pull-down back gate control signal.

Referring now to FIG. 5, the back control gates of the pull-up transistors M21, M22 are connected to a common pull-up back control gate on which a pull-up back gate control signal $\phi_{PBG}$ is applied. The pull-up back gate control signal $\phi_{PBG}$ can take voltage values within a range comprised between a low voltage level $V_{PBGL}$ and a high voltage level $V_{PBGH}$.

The back control gates of the pull-down transistors M31, M32 are connected to a common pull-down back control gate to which a pull-down back gate control signal $\phi_{NBG}$ is applied.

The pull-down back gate control signal $\phi_{NBG}$ can take voltage values within a range comprised between a low voltage level $V_{NBGL}$ and a voltage level higher than a high voltage level $V_{NBGH}$.

A sense amplifier must be turned off to avoid any conflict between the normal sensing operation and the equalization and precharge operations themselves. This is performed within state-of-the-art sense amplifiers by turning off the head and foot switch transistors T10, T40.

According to the invention, the switch transistors T10, T40 of FIG. 1 are omitted and the sense amplifier turning off operation is performed by rising the threshold voltages (in absolute values for the P channels) of the pull-up and pull-down transistors M21, M22, M31, M32 so that the transistors are not in a conducting state for the voltages applied during the precharge operation. The threshold voltages of the pull-up and pull-down transistors M21, M22, M31, M32 with respect to their front control gates are raised by means of their respective back control gates. Under such conditions, all four transistors are switched off, i.e., rendered blocking, for all possible combinations of voltages on the bit lines BL and /BL.

It shall be noted that it is possible to suppress only one of the switch transistors T10, T40, although both switch transistors are preferably omitted. The invention is described accordingly.

The sources of the pull-up transistors M21, M22 are directly connected to a first and a second global bit lines IO, /IO without an intermediate transistor. The global bit lines IO, /IO act as the pull-up voltage source for the pull-up transistors. Consequently, the voltage of the global bit lines IO, /IO act as the high supply voltage provided by the pull-up voltage source. Comparing with the afore-described prior art sense amplifier, the head switch transistor T10 is omitted, thereby resulting in a more area efficient sense amplifier.

The sources of the pull-down transistors M31, M32 are directly connected to a pull-down voltage source providing a low supply voltage $V_{Lsupply}$, without an intermediate transistor between the sources of the pull-down transistors M31, M32 and the pull-down voltage source. Comparing with the afore-described prior art sense amplifier, the foot switch transistor T40 is omitted, thereby resulting in a more area efficient sense amplifier.

Further, two transistors instead of four transistors are connected in series between the pull-up voltage source and the pull-down voltage source, thereby relaxing the constraints in terms of voltage relationships between the transistors.

Equalization can occur through the equalization transistor M50 as in case of the state-of-the-art circuit. In order to compensate possible leakages or unbalances which may result in a small deviation between the desired precharge voltage and the voltages achieved at the bit lines BL, /BL through the equalization, a precharge operation is also performed by the pull-up transistors M21, M22 or by the pull-down transistors M31, M32.

Hence the precharge transistors are constituted by the pull-up transistors M21, M22 or by the pull-down transistors M31, M32. Dedicated precharge transistors T61, T62 and the corresponding precharge control signal $\phi_{PCH}$ as shown in FIG. 1 are thus omitted.

Compared to a prior art sense amplifier, the read operation is performed by the pull-up transistors M21, M22 or by the pull-down transistors M31, M32. Hence the pass-gate transistors are constituted by the pull-up transistors M21, M22 or by the pull-down transistors M31, M32. Dedicated pass-gate transistors T71, T72 as shown in FIG. 1 are thus omitted in this second embodiment, so is the corresponding decoding control signal $Y_{DEC}$. The pass-gate transistors constituted by the pull-up transistors M21, M22 or by the pull-down transistors M31, M32 are arranged to connect the first and second bit lines BL, /BL to the first and second global bit lines IO, /IO, so as to transfer data between the first and the second bit lines (BL, /BL) and the first and second global bit lines IO, /IO, respectively.

Further, since the pass-gate transistors are preferably the pull-up transistors M21, M22, the second embodiment is described with the pull-up transistors M21, M22 as pass-gates transistors and thus connected to the global bit lines IO, /IO.

It shall be noted that should the pass-gates transistors be constituted by the pull-down transistors M31, M32, the pull-down transistors M31, M32 would be connected to the global bit lines IO, /IO instead.

The global bit lines IO, /IO are connected to a further signal processing circuit (not shown), usually referred to as a secondary sense amplifier (SSA), for processing the data. The secondary sense amplifier is in particular used for detecting and exploiting a differential signal generated on the global bit lines IO, /IO during read operations.

The equalization transistor M50 in FIG. 5 is not explicitly shown as 501 device with back control gates. Being part of an SOI integrated circuit, the equalization transistor M50 is preferably an SOI transistor as well.

The equalization transistor M50 can be made on a semiconductor-on-insulator substrate comprising a thin layer of semiconducting material isolated from a base substrate by an insulating layer, wherein the second control gates are back control gates formed in the base substrate below the insulating layer. Its back control voltage is then chosen at a value that allows its operation to be performed. Optionally, its back control gate and its front control gate may also be connected together to achieve an increased transconductance, resulting in a faster equalization for the sense amplifier.

Operating Process of a Sense Amplifier without Switch Transistors, No Dedicated Precharge Transistors, Nor Dedicated Pass-Gate Transistors The operating process of a sense amplifier as illustrated in FIG. 5 is now described. Signals that are applied to or generated within the sense amplifier are illustrated by FIGS. 6a and 6b. The depicted timing is purely illustrative.

The preferred operating process of the sense amplifier is shown in FIGS. 6a and 6b. As the function is built by means of complementary N-MOS and P-MOS transistors, all sub-functions of the sense amplifier can be swapped from the N-MOS to the P-MOS side and vice versa. For instance it is possible to precharge or equilibrate the bit lines BL, /BL with P channel devices or with N channel devices. Sensing may also be performed by the pull-up transistors M21, M22 or by the pull-down transistors M31, M32. In this illustrated process, sensing occurs through the pull-down transistors M31, M32 connected to the pull-down source voltage providing a low supply voltage $V_{Lsupply}$.

At time $t_1$, the pull-down back gate control signal $\phi_{NBG}$ is lowered to a low voltage level $V_{NBGL}$ so as to turn off the pull-down transistors M31, M32 and the pull-up back gate control signal $\phi_{PBG}$ is set to a low voltage level $V_{PBGL}$ so that the pull-up transistors M21, M22 are turned to depletion mode. The pull-up transistors M21, M22 are thus turned on.

Optionally, the pull-up transistors M21, M22 and the pull-down transistors M31, M32 can be turned off before $t_1$, for example at $t_0$, in order to be sure that they are turned off before the equalization and precharge operations start.

Also at time $t_1$, the equalization control signal $\phi_{EQL}$ is raised to a high level to turn on the equalization transistor M50 in order to initialize the equalization as previously described.

Simultaneously, the global bit line signals $\phi_{IO}$, $\phi_{/IO}$ are set to a desired precharge voltage, typically $V_{BLH}/2$. The bit lines BL, /BL are thereby set to the precharge voltage, here $V_{BLH}/2$. The related time interval corresponds to $t_1 < t < t_2$ in FIGS. 6a and 6b.

At time $t_2$, after equalization and precharge operations are completed, the equalization transistor M50 is turned off by setting the equalization control signal $\phi_{EQL}$ at a low level and the pull-up transistors M21, M22 are turned off by setting the pull-up back gate control signal $\phi_{PBG}$ at a high voltage level $V_{PBGH}$.

The global bit lines IO, /IO are set back to a high voltage level, typically $V_{BLH}$.

At time $t_3$, the select signal $\phi_{WL}$ applied to the word line WL is set at a high level $V_{WLH}$ so as to activate the cell access transistor Mc. The memory cell C and the first bit line BL share their charges. A voltage variation $\Delta V$ appears on the first bit line BL, resulting in a voltage difference between the first bit line BL and the second bit line /BL. The value of this voltage variation $\Delta V$ depends on the data initially stored in the cell C in the same manner as previously described for the prior art circuit.

Depending on whether the data initially stored in the cell C is a logic "one" or a logic "zero", this voltage variation $\Delta V$ is positive or negative, respectively. The related time interval corresponds to $t_3 < t < t_4$ in FIGS. 6a and 6b.

If a logic "one" was stored within the cell C, i.e., the voltage initially stored within the cell C is at the high voltage level $V_{BLH}$ of the voltage of the pull-up voltage source constituted by the global bit lines IO, /IO, the voltage of the first bit line BL is slightly increased. This situation is illustrated by FIG. 6a. If a logic "zero" was stored within the cell C, i.e., the voltage initially stored within the cell C is at the low voltage level $V_{BLL}$ of the supply voltage $V_{Lsupply}$ provided by the pull-down voltage source, the voltage of the first bit line BL is slightly decreased. This situation is illustrated by FIG. 6b.

At time $t_4$, the pull-down back gate control signal $\phi_{NBG}$ is raised to a high voltage level $V_{NBGH}$ that turns on the two pull-down transistors M31, M32. The voltage difference between the bit lines BL, /BL is then amplified by these two pull-down transistors M31, M32 in a similar manner as for the state-of-the-art case.

At time $t_5$, the pull-up back gate control signal $\phi_{PBG}$ is lowered to an intermediate voltage level $V_{PBGI}$ that turns on the pull-up transistors M21, M22 but keeps them in the enhancement mode. The combination of the respective actions of the pull down transistors M31, M32 and the pull-up transistors M21, M22 saturates the sense amplifier and set the respective voltages of the bit lines BL, /BL to the high voltage level $V_{BLH}$ of the pull-up voltage source and the low voltage level $V_{BLL}$ of the pull-down voltage source according to the initial value of the voltage variation $\Delta V$ (positive or negative). The operation is similar to the prior art case.

If a logic "one" was stored within the cell C, i.e., the voltage initially stored in the cell $V_{CELL}$ is at the high voltage level $V_{BLH}$, the voltage of the first bit line BL is pulled up to the high voltage level $V_{BLH}$ of the global bit lines IO, /IO while the voltage of the second bit line /BL is decreased to the low voltage level $V_{BLL}$ of the low supply voltage $V_{Lsupply}$. This situation is illustrated by FIG. 6a.

If a logic "zero" was stored within the cell C, i.e., the voltage initially stored in the cell $V_{CELL}$ corresponds to the low supply voltage $V_{Lsupply}$, the voltage of the first bit line BL is pulled down to the low supply voltage $V_{Lsupply}$, while the voltage of the second bit line /BL is pulled up to the high voltage level $V_{BLH}$ of the global bit lines IO, /IO. This situation is illustrated by FIG. 6b.

The corresponding time interval in FIGS. 6a and 6b is $t_5 < t < t_6$.

The content of the cell C is then restored to its initial value as the word line WL is still activated and thus the cell access transistor $M_C$ is still conducting, thereby connecting the memory cell C to the sense amplifier through the first bit line BL. The two bit lines BL and /BL are saturated at CMOS voltage levels, avoiding any current through the sense amplifier. The data is thus written back into the memory cell C.

At time $t_6$, the word line WL is deactivated, i.e., the select signal $\phi_{WL}$ is set at low level $V_{WLL}$, and the cell access transistor Mc is thus turned off. The cell content is protected and the sense amplifier can be addressed.

Read operations are performed by generating differential signals on the global bit lines IO, /IO, the signals being exploited by the secondary sense amplifier according to the characteristics of the secondary sense amplifier in order to read data. For example, if the secondary sense amplifier sets the global bit lines IO, /IO at relatively high impedance, the differential signal is a voltage drop associated with one of the global bit lines. This is the example described hereafter and illustrated by FIGS. 6a and 6b.

Alternatively, if the secondary sense amplifier sets the global bit lines IO, /IO at low impedance, the differential signal is a current flowing through one of the global bit lines.

Therefore, in the depicted example, at time $t_6$ the two global bit lines IO, /IO are kept at a high voltage level, typically at or somewhat below $V_{BLH}$, but are turned to a higher impedance than their previous impedance, for example by means of the so-called secondary sense amplifier (not shown).

Two read operations performed by the sense amplifier are depicted by FIGS. 6a and 6b. The first read operation occurs between $t_4$ and $t_B$, the second read operation occurs between $t_4'$ and $t_B'$. However, the sense amplifier can perform read operations as many times as necessary.

At time $t_4$, after $t_6$, the pull-down back gate control signal $\phi_{NBG}$ is set to a value higher than its previous high value $V_{BLH}$. This higher voltage level is able to turn both pull-down transistors M31, M32 to depletion mode.

Since one of the bit lines BL, /BL is at the high voltage $V_{BLH}$ of the pull-up voltage source constituted by the global bit lines IO, /IO, whereas the other bit line BL, /BL is at the low voltage $V_{BLL}$ of the low supply voltage $V_{Lsupply}$, one of the pull-up transistor M21, M22 has a low voltage level applied to its front gate whereas the other has a high voltage level applied to its front gate.

Since the pull-up transistors M21, M22 are in the enhancement mode, the pull-up transistor with a low voltage level on its front gate is in the on state, while the other pull-up transistor is in the off state.

If the voltage of the first bit line BL is at the high voltage level $V_{BLH}$, and the voltage of the second bit line /BL is at the low voltage level $V_{BLL}$, i.e., if the accessed cell stores a logic "one", the pull-up transistor M21 with its front gate connected to the second bit line /BL would be conducting and the other pull-up transistor M22 would be off.

If the voltage of the first bit line BL is at the low voltage level $V_{BLL}$ and the voltage of the second bit line /BL is at the high voltage level $V_{BLH}$, i.e., if the accessed cell stores a logic "zero", the pull-up transistor M22 with its front gate connected to the first bit line BL would be conducting and the other pull-up transistor M21 would be off.

With both pull-down transistors M31, M32 in depletion mode and one of the pull-up transistors M21, M22 in the on state, a current flows either through the first global bit line IO or the second bit line /IO, depending on which one of the pull-up transistors M21, M22 is conducting.

As illustrated by FIGS. 6a and 6b between $t_A$ and $t_B$ and between $t_A'$, and $t_B'$, this current generates a voltage drop associated with the global bit line through which the current flows. The voltage drop is detected by the secondary sense amplifier (not shown) and indicates the data stored in the memory cell C. If a logic "one" is stored in the cell C, the voltage drop is associated with first global bit line IO. If a logic "zero" is stored in the cell C, the voltage drop is associated with the second global bit line /IO.

An alternate solution where the differential signal is based on electric current consists in keeping the first and second global bit lines IO, /IO at low impedance and in detecting the current flowing through the global bit lines.

After $t_0'$, at time $t_1'$, a new cycle starts by toggling the pull-down back gate control signal $\phi_{NBG}$ and the pull-up back gate control signal $\phi_{PBG}$ in order to turn off the sense amplifier. The global bit lines IO, /IO are turned to their initial low impedance. New equalization and precharge operations are started.

Writing data into the cell C is done by applying the desired signal to the global bit lines IO, /IO when the pull-up transistors M21, M22 are conducting, e.g. between $t_5$ and $t_6$. This can be during a dedicated cycle or within the previously described cycle.

As already mentioned, the precharge operation can be performed by the pull-down transistors M31, M32 instead of the pull-up transistors M21, M22. In that case, the following back gate control signal patterns are applied to the pull-down transistors M31, M32 and to the pull-up transistors M21, M22. During the precharge operation, i.e., between $t_1$ and $t_2$, the pull-down back gate control signal $\phi_{NBG}$ is set at a high voltage level $V_{NBGH}$ so as to turn on the pull-down transistors M31, M32, while the pull-up back gate control signal $\phi_{PBG}$ is set at a high voltage level $V_{PBGH}$ so as to turn off the pull-up transistors M21, M22.

The desired precharge voltage has to be applied to the sources of the pull-down transistors M31, M32 so as to precharge the bit lines BL, /BL at the precharge level, typically $V_{BLH}/2$. The voltage of the pull-down voltage source to which are connected the source nodes of the pull-down transistors M31, M32, is set at the precharge level, for example $V_{BLH}/2$, between $t_1$ and $t_2$ and is otherwise kept at the low voltage level $V_{BLL}$.

The other operations are performed by means of the control signals already described.

As already mentioned, the sensing operation can be performed by the pull-up transistors M21, M22 instead of the pull-down transistors M31, M32. In that case, the following back gate control signal patterns are applied to the pull-down transistors M31, M32 and to the pull-up transistors M21, M22. During the sensing operation, i.e., between $t_4$ and $t_5$, the pull-up back gate control signal $\phi_{PBG}$ is set at a low voltage level $V_{PBGL}$ so as to turn on the pull-up transistors M21, M22, while the pull-down back gate control signal $\phi_{NBG}$ is kept at a low voltage level $V_{NBGL}$ so as to keep the pull-down transistors M31, M32 in the off state. The other operations are performed by means of the control signals already described.

As already mentioned, the pass-gate transistors can be the pull-down transistors M31, M32 instead of the pull-up transistors M21, M22. In that case, the following back gate control signal patterns are applied to the pull-down transistors M31, M32 and to the pull-up transistors M21, M22. During the read operations, i.e., between $t_4$ and $t_B$ or between $t_A'$ and $t_B'$, the pull-up back gate control signal $\phi_{PBG}$ is set to a voltage level lower than its previous low voltage level $V_{NBGL}$. This lower voltage level is able to turn both pull-up transistors M21, M22 to depletion mode.

As the sources of the pull-down transistors M31, M32 are connected to the global bit lines IO, /IO, the global bit lines are usually at a low voltage level $V_{BLL}$ acting as the low supply voltage, and the differential signal associated with one of the global bit lines is detected and exploited by the secondary sense amplifier as previously described. The other operations are performed by the control signals already described.

Equalization Transistor Physically Arranged Between the Pull-Up Transistors

In the two previously described embodiments of the invention, the equalization transistor M50 was an N-MOS type transistor, and the equalization control signal $\phi_{EQL}$ was controlled accordingly.

As previously mentioned, the function is built by means of complementary N-MOS and P-MOS transistors. Therefore, all subfunctions of the sense amplifier can be swapped to the opposite type of transistors. For instance it is possible to equilibrate the bit lines BL, /BL with P channel devices or N channel devices.

Figure 7:
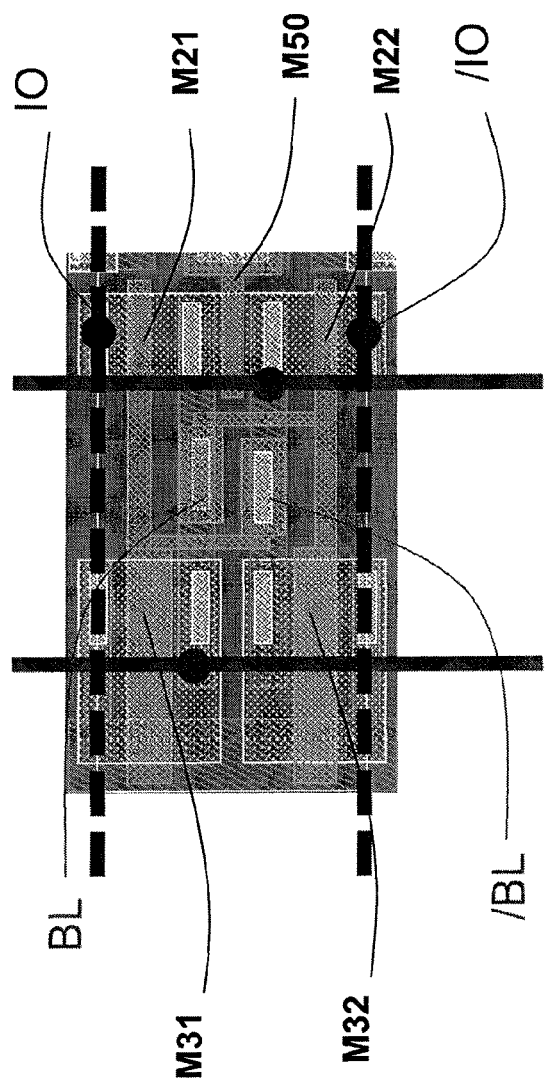
FIG. 7 illustrates a possible topology of a sense amplifier according to the second embodiment.

In a preferred embodiment, the equalization transistor M50 is a P-MOS transistor. As illustrated in FIG. 7, the P-MOS equalization transistor M50 can then be physically arranged between the two P-MOS type pull-up transistors M21, M22. In other words, the channel of the equalization transistor M50 is arranged between the drains of the two pull-up transistors M21, M22.

The equalization transistor M50 can thus be provided without requiring additional area with regard to the area occupied by the two CMOS inverters of a sense amplifier.

Further, the equalization transistor M50 can be a multigate transistor having at least a first control gate and a second control gate connected together to achieve a greater transconductance, resulting in a faster equalization operation.

Equalization Transistor Arranged Between the Global Bit Lines IO, /IO

Figure 8:
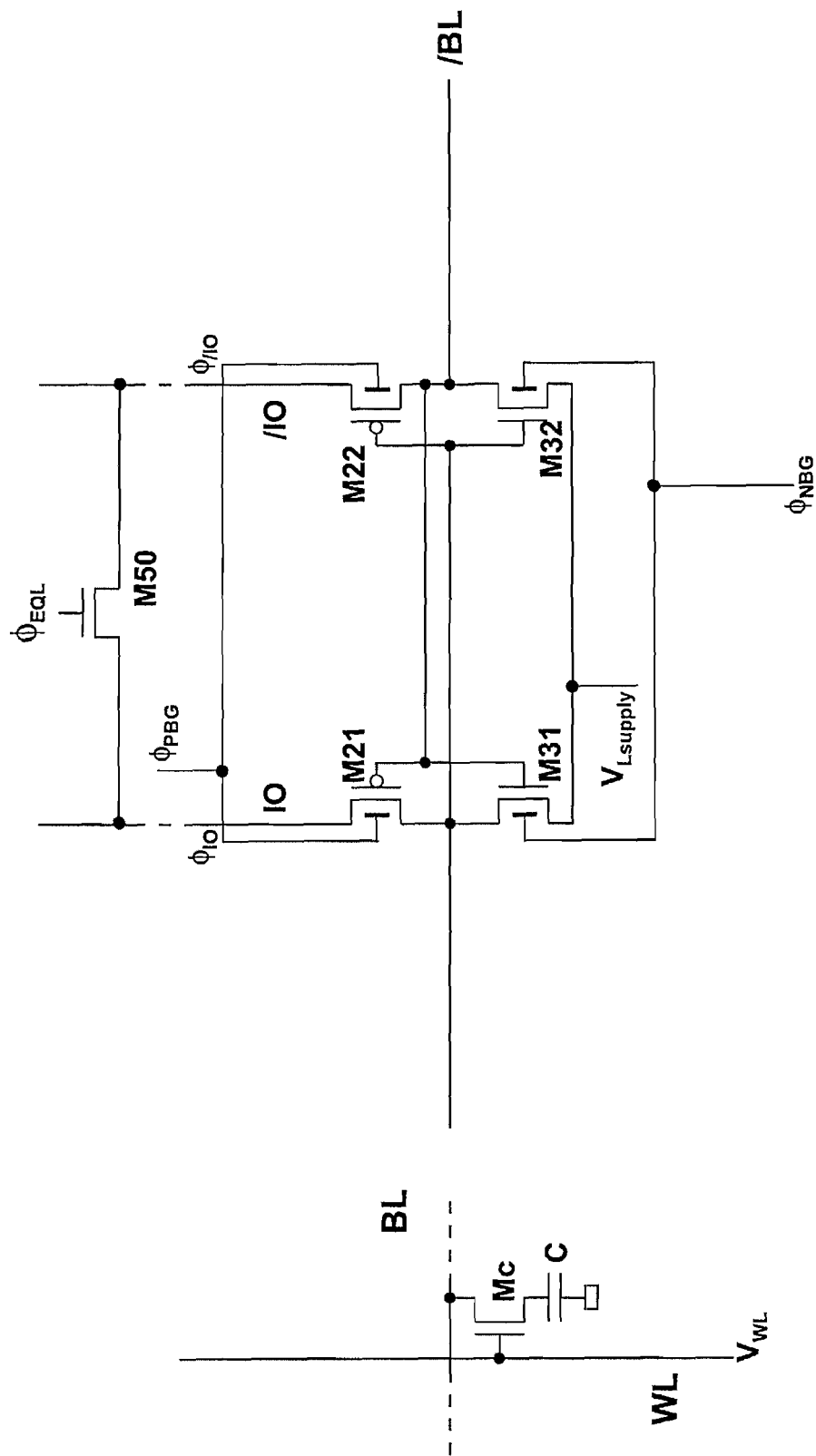
FIG. 8 is a circuit diagram of the sense amplifier according to the second embodiment with an equalization transistor arranged between the global bit lines.

It is possible to have an equalization transistor arranged between the global bit lines IO, /IO instead of being arranged between the first and second bit lines BL, /BL. This is illustrated by FIG. 8 in the case of the second embodiment. The equalization transistor M50 thus performs equalization on the global bit lines IO, /IO instead of performing equalization on the bit lines BL, /BL.

The same equalization transistor M50 may therefore perform equalization for all the sense amplifiers that share the same global bit lines IO, /IO. Moreover, the equalization transistor M50 is no more related to a particular sense amplifier and may be part of the upper hierarchical circuit that drives the global bit lines IO, /IO. As a consequence, it can be arranged at the convenience of the design, preferably external from the repetitive sense amplifier bank. Since the equalization transistor M50 is no more arranged within the sense amplifier circuit, it is possible to choose either a P-MOS device or N-MOS device for the equalization transistor M50. Further, the sense amplifier can be smaller.

Accordingly, the bit lines BL, /BL are not shorted directly by any equalization transistor. The equalization occurs between the global bit lines IO, /IO and is propagated to the bit lines BL, /BL through the pass gate transistors. The global bit lines IO, /IO are set to the desired precharge voltage during the equalization and precharge operations.

The pass gate transistors are constituted by the pull-up or the pull-down transistors M21, M22, M31, M32. The pass gate transistors are turned to depletion mode by means of the respective voltage of their back control gates. After the equalization and precharge is completed, the pass gate transistors constituted by the pull-down or pull-up transistors M21, M22, M31, M32, are returned to the enhancement mode by means of their back control gates. They are in fact turned off as there is no signal between their gates and their sources. The further operations are the same as previously described.

A Semiconductor Memory Comprising a Plurality of Memory Cells

Figure 9:
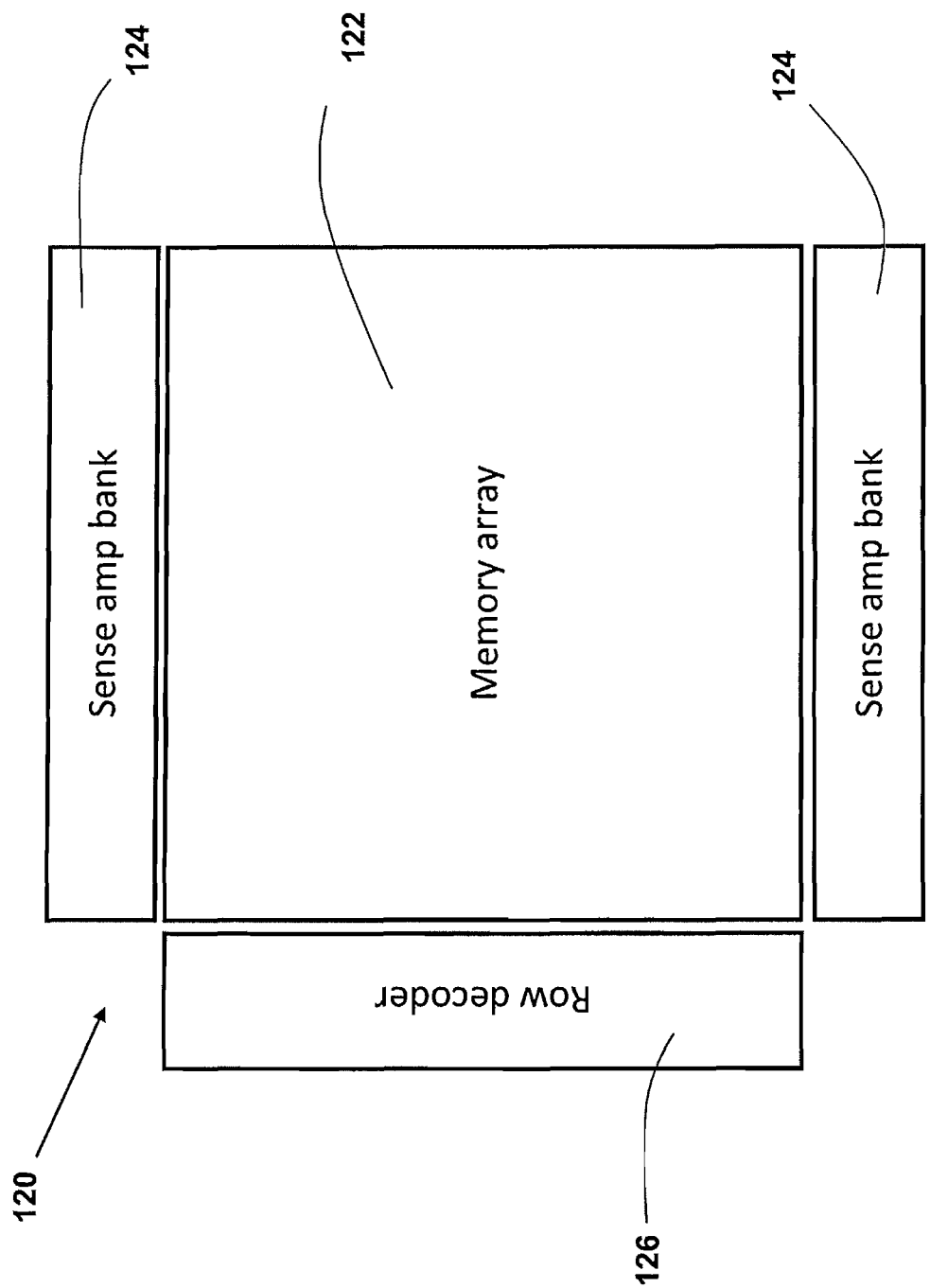
FIG. 9 illustrates a semiconductor memory in accordance with a third aspect of the invention.

According to a third aspect of the invention, a semiconductor memory 120 incorporating a memory cell array 122 and at least one sense amplifier according to the first aspect of the invention is illustrated in FIG. 9.

A memory cell array 122 is illustrated, provided with a bank 124 of sense amplifier according to the first aspect of the invention on two of its opposite sides. A third side of the memory cell array 122 is provided with a row decoder 126.

Preferably, this semiconductor memory 120 is a Dynamic Random Access Memory (DRAM), but can be of any other suitable type of memory, for example a Static Random Access Memory (SRAM).

What is claimed is:

1. A voltage differential sense amplifier for sensing data stored in a plurality of memory cells of a memory cell array, comprising:
    a first CMOS inverter having an output connected to a first bit line and an input connected to a second bit line complementary to the first bit line, and
    a second CMOS inverter having an output connected to the second bit line and an input connected to the first bit line, with each CMOS inverter comprising:
        a pull-up transistor having a drain and a source, and
        a pull-down transistor having a drain and a source,
    with the pull-up transistor and the pull-down transistor of each CMOS inverter having a common drain, and
    a pair of pass-gate transistors arranged to connect the first and second bit lines to first and second global bit lines respectively to transfer data between the first and the second bit lines and the first and the second global bit lines, with the pass-gate transistors constituted by one of the pull-up transistors or the pull-down transistors.

2. The differential sense amplifier according to claim 1, wherein the pull-up and the pull-down transistors are multigate transistors having at least a first control gate and a second control gate, and wherein:
    the second control gates of the pull-up transistors are driven by a pull-up second control signal, and
    the second control gates of the pull-down transistors are driven by a pull-down second control signal.

3. The differential sense amplifier according to claim 2, which is present on a semiconductor-on-insulator substrate comprising a base substrate, and a thin layer of semiconducting material isolated from the base substrate by an insulating layer, wherein the second control gates are back control gates formed in the base substrate below the insulating layer.

4. The differential sense amplifier according to claim 2, wherein the transistors are FinFET devices with independent double gates.

5. The differential sense amplifier according to claim 2, further comprising an equalization transistor having a source and a drain respectively coupled to one of the first and second bit lines.

6. The differential sense amplifier according to claim 5, wherein the equalization transistor is a multigate transistor having at least a first control gate and a second control gate connected together.

7. The differential sense amplifier according to claim 5, wherein the equalization transistor is a P-MOS type transistor physically arranged between the pull-up transistors.

8. The differential sense amplifier according to claim 2, further comprising a pair of precharge transistors arranged to be respectively coupled to the first and second bit lines, respectively, to precharge the first and second bit lines to a precharge voltage, wherein the precharge transistors are constituted by the pull-up transistors or by the pull-down transistors.

9. The differential sense amplifier according to claim 2, wherein:
    the pass-gate transistors are constituted by the pull-up transistors, and
    the sources of the pull-down transistors are electrically coupled and connected to a pull-down voltage source, without an intermediate transistor between the sources of the pull-down transistors and the pull-down voltage source.

10. The differential sense amplifier according to claim 2, wherein:
    the pass-gate transistors are constituted by the pull-down transistors, and
    the sources of the pull-up transistors are electrically coupled and connected to a pull-up voltage source, without an intermediate transistor between the sources of the pull-up transistors and the pull-up voltage source.

11. The differential sense amplifier according to claim 1 further comprising a pair of precharge transistors that are multigate transistors having at least a first control gate connected to a second control gate.

12. A method for controlling a voltage differential sense amplifier comprising:
    a first CMOS inverter having an output connected to a first bit line and an input connected to a second bit line complementary to the first bit line, and
    a second CMOS inverter having an output connected to the second bit line and an input connected to the first bit line, with each CMOS inverter comprising:
        a pull-up transistor having a drain and a source, and
        a pull-down transistor having a drain and a source,
    with the pull-up transistor and the pull-down transistor of each CMOS inverter having a common drain, and
    a pair of pass-gate transistors arranged to connect the first and second bit lines to first and second global bit lines respectively to transfer data between the first and the second bit lines and the first and the second global bit lines, with the pass-gate transistors constituted by one of the pull-up transistors or the pull-down transistors,
the method comprising controlling the sense amplifier to perform operations for pre-charging the bit lines, sensing and writing-back data stored in a plurality of memory cells of a memory cell array, which comprises modifying the operation performed by the differential sense amplifier by modifying the pull-up second control signal or the pull-down second control voltage.

13. The method according to claim 12, which further comprises, during a precharge operation, applying a low pull-up second control signal to the second control gates of the pull-up transistors so that the pull-up transistors are conducting, and applying a low pull-down second control signal to the second control gates of the pull-down transistors so that the pull-down transistors are not conducting.

14. The method according to claim 12, which further comprises, during a precharge operation, applying a high pull-up second control signal to the second control gates of the pull-up transistors so that the pull-up transistors are not conducting, and applying a high pull-down second control signal to the second control gates of the pull-down transistors so that the pull-down transistors are conducting.

15. The method according to claim 12, which further comprises, during a sensing operation, applying a high pull-down second control signal to the second control gates of the pull-down transistors so that the pull-down transistors are conducting, and applying a high pull-up second control signal to the second control gates of the pull-up transistors so that the pull-up transistors are not conducting.

16. The method according to claim 12, which further comprises, during a sensing operation, applying a low pull-down second control signal to the second control gates of the pull-down transistors so that the pull-down transistors are not conducting, and applying a low pull-up second control signal to the second control gates of the pull-up transistors so that the pull-up transistors are conducting.

17. The method according to claim 12, which further comprises, during a write back operation, applying a low pull-up second control signal to the second control gates of the pull-up transistors so that the pull-up transistors are conducting, and applying a high pull-down second control signal to the second control gates of the pull-down transistors so that the pull-down transistors are conducting.

18. The method according to claim 12, wherein:
the pass-gate transistors are constituted by the pull-up transistors, and
the sources of the pull-down transistors are electrically coupled and connected to a pull-down voltage source, without an intermediate transistor between the sources of the pull-down transistors and the pull-down voltage source,
wherein the method further comprises performing a read operation, which comprises applying a high pull-down second control signal to the second control gates of the pull-down transistors to turn the pull-down transistors into depletion mode.

19. The method according to claim 12, wherein:
the pass-gate transistors are constituted by the pull-down transistors, and
the sources of the pull-up transistors are electrically coupled and connected to a pull-up voltage source, without an intermediate transistor between the sources of the pull-up transistors and the pull-up voltage source,
wherein the method further comprises performing a read operation, which comprises applying a low pull-up second control signal to the second control gates of the pull-up transistors to turn the pull-up transistors into depletion mode.

20. A semiconductor memory comprising:
a memory cell array comprising at least one voltage differential sense amplifier comprising:
a first CMOS inverter having an output connected to a first bit line and an input connected to a second bit line complementary to the first bit line, and
a second CMOS inverter having an output connected to the second bit line and an input connected to the first bit line,
with each CMOS inverter comprising:
a pull-up transistor having a drain and a source, and
a pull-down transistor having a drain and a source,
with the pull-up transistor and the pull-down transistor of each CMOS inverter having a common drain, and
a pair of pass-gate transistors arranged to connect the first and second bit lines to first and second global bit lines respectively to transfer data between the first and the second bit lines and the first and the second global bit lines, with the pass-gate transistors constituted by one of the pull-up transistors or the pull-down transistors.

* * * * *